(12) United States Patent
Golda et al.

(10) Patent No.: US 9,095,980 B2
(45) Date of Patent: Aug. 4, 2015

(54) MICRO PICK UP ARRAY MOUNT WITH INTEGRATED DISPLACEMENT SENSOR

(71) Applicant: LuxVue Technology Corporation, Santa Clara, CA (US)

(72) Inventors: Dariusz Golda, Redwood City, CA (US); John A. Higginson, Santa Clara, CA (US); Andreas Bibl, Los Altos, CA (US); Paul Argus Parks, Austin, TX (US); Stephen Paul Bathurst, Lafayette, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 208 days.

(21) Appl. No.: 13/776,188

(22) Filed: Feb. 25, 2013

(65) Prior Publication Data

US 2014/0241844 A1   Aug. 28, 2014

(51) Int. Cl.
*B25J 11/00* (2006.01)
*H01L 21/00* (2006.01)
*B25J 15/00* (2006.01)

(52) U.S. Cl.
CPC .............. *B25J 11/00* (2013.01); *B25J 15/0052* (2013.01); *B25J 15/0085* (2013.01)

(58) Field of Classification Search
USPC .................. 228/47.1, 49.5; 414/751.1, 752.1
See application file for complete search history.

(56) References Cited

U.S. PATENT DOCUMENTS

| 5,592,358 | A | 1/1997 | Shamouilian et al. |
| 5,839,187 | A | 11/1998 | Sato et al. |
| 5,851,664 | A | 12/1998 | Bennett et al. |
| 5,888,847 | A | 3/1999 | Rostoker et al. |
| 5,903,428 | A | 5/1999 | Grimard et al. |
| 5,996,218 | A | 12/1999 | Shamouilian et al. |
| 6,071,795 | A | 6/2000 | Cheung et al. |
| 6,335,263 | B1 | 1/2002 | Cheung et al. |
| 6,403,985 | B1 | 6/2002 | Fan et al. |
| 6,420,242 | B1 | 7/2002 | Cheung et al. |
| 6,521,511 | B1 | 2/2003 | Inoue et al. |
| 6,558,109 | B2 * | 5/2003 | Gibbel ...................... 414/795.5 |
| 6,613,610 | B2 | 9/2003 | Iwafuchi et al. |
| 6,629,553 | B2 | 10/2003 | Odashima et al. |
| 6,670,038 | B2 | 12/2003 | Sun et al. |

(Continued)

FOREIGN PATENT DOCUMENTS

| CN | 101863035 A | 10/2010 |
| JP | 61-265218 A | 11/1986 |

(Continued)

OTHER PUBLICATIONS

Liu, "Piezoresistive Sensors", 2005, chap. 6, p. 207-230.*

(Continued)

*Primary Examiner* — Devang R Patel
(74) *Attorney, Agent, or Firm* — Blakely, Sokoloff, Taylor & Zafman LLP

(57) ABSTRACT

Systems and methods for transferring a micro device from a carrier substrate are disclosed. In an embodiment, a mass transfer tool manipulator assembly allows active alignment between an array of electrostatic transfer heads on a micro pick up array and an array of micro devices on a carrier substrate. Displacement of a compliant element of the mass transfer tool manipulator assembly may be sensed to control alignment between the array of electrostatic transfer heads and the array of micro devices.

17 Claims, 27 Drawing Sheets

(56) References Cited

U.S. PATENT DOCUMENTS

| | | | |
|---|---|---|---|
| 6,786,390 | B2 | 9/2004 | Yang et al. |
| 6,878,607 | B2 | 4/2005 | Inoue et al. |
| 7,033,842 | B2 | 4/2006 | Haji et al. |
| 7,148,127 | B2 | 12/2006 | Oohata et al. |
| 7,208,337 | B2 | 4/2007 | Eisert et al. |
| 7,353,596 | B2 | 4/2008 | Shida et al. |
| 7,358,158 | B2 | 4/2008 | Aihara et al. |
| 7,585,703 | B2 | 9/2009 | Matsumura et al. |
| 7,723,764 | B2 | 5/2010 | Oohata et al. |
| 7,795,629 | B2 | 9/2010 | Watanabe et al. |
| 7,797,820 | B2 | 9/2010 | Shida et al. |
| 7,838,410 | B2 | 11/2010 | Hirao et al. |
| 7,880,184 | B2 | 2/2011 | Iwafuchi et al. |
| 7,884,543 | B2 | 2/2011 | Doi |
| 7,888,690 | B2 | 2/2011 | Iwafuchi et al. |
| 7,906,787 | B2 | 3/2011 | Kang |
| 7,910,945 | B2 | 3/2011 | Donofrio et al. |
| 7,927,976 | B2 | 4/2011 | Menard |
| 7,928,465 | B2 | 4/2011 | Lee et al. |
| 7,972,875 | B2 | 7/2011 | Rogers et al. |
| 7,999,454 | B2 | 8/2011 | Winters et al. |
| 8,023,248 | B2 | 9/2011 | Yonekura et al. |
| 8,333,860 | B1 * | 12/2012 | Bibl et al. ............... 156/249 |
| 8,349,116 | B1 | 1/2013 | Bibl et al. |
| 8,415,768 | B1 * | 4/2013 | Golda et al. ............... 257/619 |
| 2001/0029088 | A1 | 10/2001 | Odajima et al. |
| 2002/0076848 | A1 | 6/2002 | Spooner et al. |
| 2003/0010975 | A1 | 1/2003 | Gibb et al. |
| 2003/0177633 | A1 | 9/2003 | Haji et al. |
| 2006/0160276 | A1 | 7/2006 | Brown et al. |
| 2006/0214299 | A1 | 9/2006 | Fairchild et al. |
| 2007/0014920 | A1 * | 1/2007 | Syms ........................ 427/256 |
| 2007/0166851 | A1 | 7/2007 | Tran et al. |
| 2007/0194330 | A1 | 8/2007 | Ibbetson et al. |
| 2008/0163481 | A1 | 7/2008 | Shida et al. |
| 2009/0068774 | A1 | 3/2009 | Slater et al. |
| 2009/0146303 | A1 | 6/2009 | Kwon |
| 2009/0303713 | A1 | 12/2009 | Chang et al. |
| 2009/0314991 | A1 | 12/2009 | Cho et al. |
| 2010/0142114 | A1 * | 6/2010 | Purohit et al. ............... 361/234 |
| 2010/0178139 | A1 * | 7/2010 | Sundar et al. ............ 414/225.01 |
| 2010/0188794 | A1 * | 7/2010 | Park et al. ............... 361/234 |
| 2010/0203661 | A1 | 8/2010 | Hodota |
| 2010/0248484 | A1 | 9/2010 | Bower et al. |
| 2010/0276726 | A1 | 11/2010 | Cho et al. |
| 2011/0003410 | A1 | 1/2011 | Tsay et al. |
| 2011/0151602 | A1 | 6/2011 | Speier |
| 2012/0064642 | A1 | 3/2012 | Huang et al. |
| 2012/0134065 | A1 | 5/2012 | Furuya et al. |
| 2013/0300812 | A1 * | 11/2013 | Bibl et al. ............... 347/159 |
| 2014/0169924 | A1 * | 6/2014 | Golda et al. ............... 414/752.1 |
| 2014/0169927 | A1 * | 6/2014 | Golda et al. ............... 414/800 |

FOREIGN PATENT DOCUMENTS

| | | |
|---|---|---|
| JP | 3406207 | 5/1999 |
| WO | WO 00-67543 A1 | 11/2000 |
| WO | WO 2008-052594 A1 | 5/2008 |
| WO | WO 2011/123285 | 10/2011 |

OTHER PUBLICATIONS

PCT International Search Report and Written Opinion for International Application No. PCT/US2014/016418, mailed May 27, 2014, 10 pages.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

* cited by examiner

A - A

MICRO PICK UP ARRAY MOUNT WITH INTEGRATED DISPLACEMENT SENSOR

BACKGROUND

1. Field

The present invention relates to micro devices. More particularly, embodiments of the present invention relate to systems and methods for transferring a micro device from a carrier substrate.

2. Background Information

The feasibility of commercializing miniaturized devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Manufacturing processes typically include wafer based processing and transferring techniques.

Device transferring processes include transfer from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer and bond the devices to a receiving wafer. Following transfer, the transfer wafer may be removed using techniques that include laser lift-off (LLO), grinding or polishing, and etching.

Gimbal mechanisms have been used in wafer polishing equipment to facilitate evenly polishing a wafer. For example, passive gimbal mechanisms in polishing equipment facilitate alignment of wafers with a polishing pad.

SUMMARY OF THE DESCRIPTION

A mass transfer tool manipulator assembly and methods of using the mass transfer tool manipulator assembly to transfer an array of micro devices from a carrier substrate are disclosed. In an embodiment, the mass transfer tool manipulator assembly includes a housing, a tip-tilt-z flexure, an actuator assembly, and a micro pick up array mount. A micro pick up array may be provided separately from the mass transfer tool manipulator assembly or integrally formed with the mass transfer tool manipulator assembly. The tip-tilt-z flexure may include a top flexure component joined with the housing and connected with a bottom flexure component by a flexible coupling. For example, the top flexure component and bottom flexure component may be flanges connected by the flexible coupling. The actuator assembly may be operably coupled with the bottom flexure component such that actuation of the actuator assembly moves the bottom flexure component relative to the top flexure component. For example, in an embodiment, the mass transfer tool manipulator assembly includes a distribution plate coupling the actuator assembly with the bottom flexure component. The micro pick up array mount may also be coupled with the bottom flexure component. Furthermore, the micro pick up array mount may include a pivot platform coupled with a compliant element, such as a beam. A displacement sensor may be integrated with the compliant element. In an embodiment, a micro pick up array having a substrate supporting an electrostatic transfer head may be joinable with the pivot platform.

In an embodiment, the micro pick up array mount may further include a base laterally around the pivot platform with the compliant element between the pivot platform and the base and coupled with the pivot platform and base at pivots. For example, the compliant element may be coupled with the base at an outer pivot on a base edge, and coupled with the pivot platform at an inner pivot on a pivot platform edge that is orthogonal to the base edge. The compliant element may also be coupled with the pivot platform at a second inner pivot across the pivot platform from the inner pivot and coupled with the base at a second outer pivot across the pivot platform from the outer pivot. In an embodiment, the micro pick up array mount may include a second compliant element coupled with the base by the second outer pivot on a second base edge and coupled with the pivot platform by the second inner pivot on a second pivot platform edge. Furthermore, a second displacement sensor may be integrated with the second compliant element.

In an embodiment, the displacement sensor may be a strain gauge attached to a high strain region of the compliant element near the inner pivot or the outer pivot. For example, the strain gauge may be bonded to the high strain region. Alternatively, the strain gauge may be deposited on the high strain region. Furthermore, the strain gauge may be formed by doping the high strain region. In an embodiment, the micro pick up array mount may include a reference strain gauge adjacent to the displacement sensor on the compliant element. The displacement sensor and the reference strain gauge may provide adjacent legs in a half Wheatstone bridge.

In an embodiment, the micro pick up array mount may include various contacts and electrical connections. For example, the micro pick up array mount may include a displacement sensor contact on the base in electrical connection with the displacement sensor. In an embodiment, the mass transfer tool manipulator assembly may include a position sensing module in electrical connection with the displacement sensor through the displacement sensor contact. For example, the displacement sensor contact may be in electrical connection with the position sensing module through a flex circuit or a spring contact. In an embodiment, the micro pick up array mount may include a base operating voltage contact on the base in electrical connection with a pivot platform operating voltage contact on the pivot platform. Furthermore, the micro pick up array mount may include a base clamp contact on the base in electrical connection with a clamp electrode at a bonding site on the pivot platform. In an embodiment, the micro pick up array mount may include a bonding site on the pivot platform that includes a metal such as gold, copper, or aluminum.

In an embodiment, the micro pick up array mount may also include a temperature sensor and a heating element on the pivot platform. The heating element may include a resistance alloy or a surface-mount technology resistor, for example. Furthermore, the mass transfer tool manipulator assembly may include an insulation plate between the heating element and the position sensing module. The base of the micro pick up array mount may be coupled with the insulation plate and the insulation plate may further be coupled with the distribution plate.

In an embodiment, a method includes moving a mass transfer tool manipulator assembly toward a carrier substrate and contacting an array of micro devices on the carrier substrate with an array of electrostatic transfer heads coupled with a pivot platform of the mass transfer tool manipulator assembly. The method may also include sensing deformation of a compliant element coupled with the pivot platform. For example, sensing deformation may include sensing strain in a displacement sensor integrated with the compliant element. In an embodiment, the method further includes adjusting a position of a base coupled with the compliant element after sensing deformation and before stopping relative movement between the mass transfer tool manipulator assembly and the carrier substrate. For example, adjusting the position may include actuating an actuator assembly coupled to the base to further align the base to a plane of the carrier substrate by tipping or tilting the base. The method may also include applying a voltage to the array of electrostatic transfer heads to create a grip pressure on the array of micro devices and picking up the array of micro devices from the carrier substrate. In an embodiment, the method includes applying heat to the array of electrostatic transfer heads while picking up the array of micro devices.

In an embodiment, a method includes moving a mass transfer tool manipulator assembly toward a receiving substrate and contacting the receiving substrate with an array of micro devices carried by an array of electrostatic transfer heads coupled with a pivot platform of the mass transfer tool manipulator assembly. The method may also include sensing deformation of a compliant element coupled with the pivot platform. For example, sensing deformation may include sensing strain in a displacement sensor integrated with the compliant element. In an embodiment, the method further includes adjusting a position of a base coupled with the compliant element after sensing deformation and before stopping relative movement between the mass transfer tool manipulator assembly and the receiving substrate. For example, adjusting the position may include actuating an actuator assembly coupled with the base to further align the base to a plane of the receiving substrate by tipping or tilting the base. The method may also include removing a voltage from the array of electrostatic transfer heads and releasing the array of micro devices onto the receiving substrate. In an embodiment, the method includes applying heat to the array of electrostatic transfer heads before removing the voltage.

DETAILED DESCRIPTION

Figure 1:
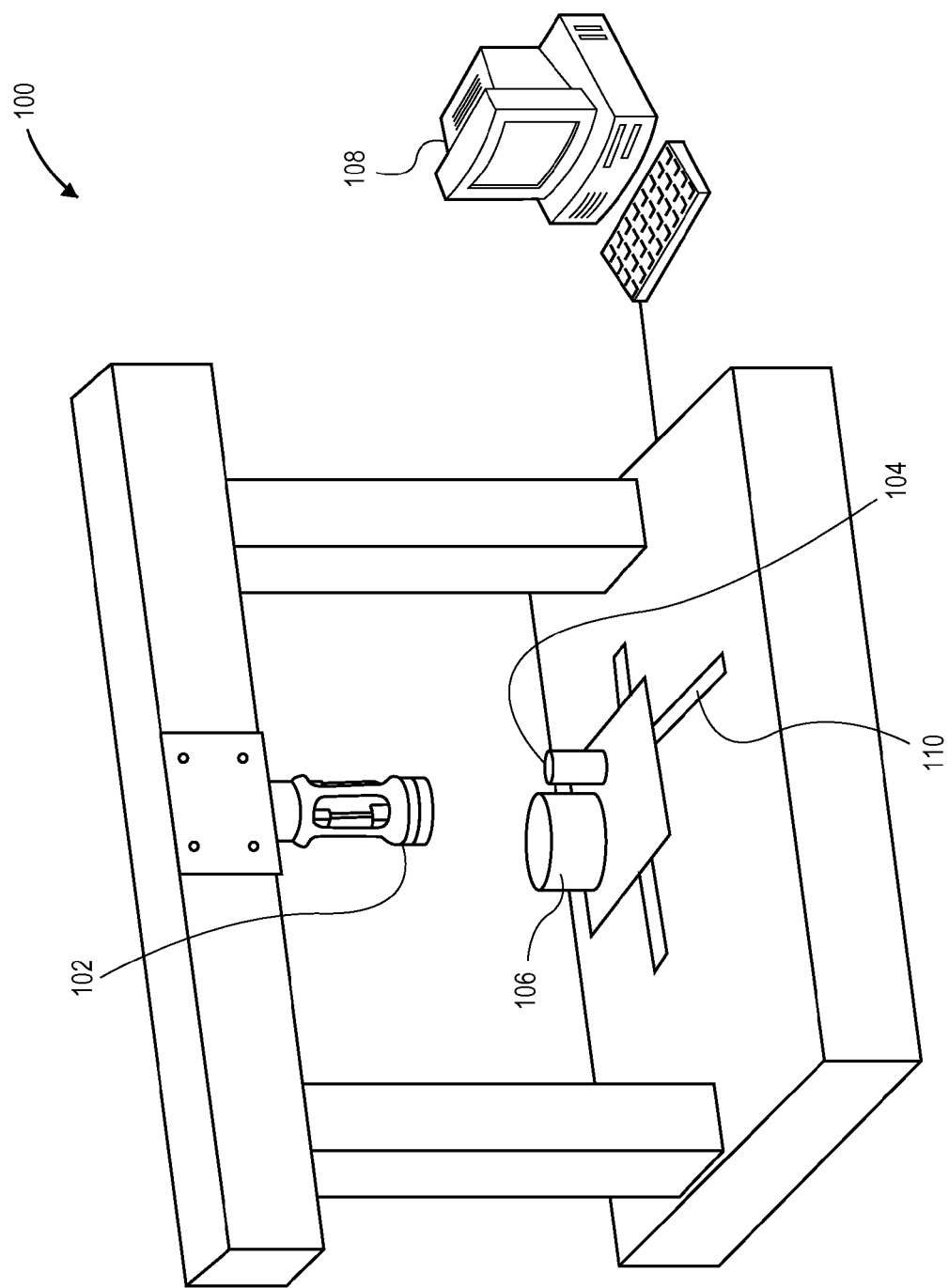
FIG. 1 is a perspective view illustration of a mass transfer tool in accordance with an embodiment of the invention.

Embodiments of the present invention describe systems and methods for transferring a micro device or an array of micro devices from a carrier substrate. For example, the micro devices or array of micro devices may be any of the micro LED device structures illustrated and described in related U.S. patent application Ser. Nos. 13/372,222, 13/436,260, 13/458,932, and 13/625,825. While some embodiments of the present invention are described with specific regard to micro LED devices, the embodiments of the invention are not so limited and certain embodiments may also be applicable to other micro LED devices and micro devices such as diodes, transistors, integrated circuit (IC) chips, and MEMS.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between", and "on" as used herein may refer to a relative position of one layer or component with respect to other layers or components. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, embodiments of the present invention are not necessarily so limited, and certain aspects of the embodiments may be applicable to larger and possibly smaller size scales. In an embodiment, a single micro device in an array of micro devices, and a single electrostatic transfer head in an array of electrostatic transfer heads both have a maximum dimension, for example length or width, of 1 to 100 μm. In an embodiment, the top contact surface of each micro device or electrostatic transfer head has a maximum dimension of 1 to 100 μm. In an embodiment, the top contact surface of each micro device or electrostatic transfer head has a maximum dimension of 3 to 20 μm. In an embodiment, a pitch of an array of micro devices, and a pitch of a corresponding array of electrostatic transfer heads, may be (1 to 100 μm) by (1 to 100 μm), for example, a 20 μm by 20 μm or a 5 μm by 5 μm pitch. In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage may be applied to a micro device transfer head in order to generate a grip pressure on a micro device and pick up the micro device.

In an aspect, embodiments of the invention describe systems and methods for the mass transfer of micro devices using a mass transfer tool manipulator assembly having a feedback mechanism for regulating alignment of an array of electrostatic transfer heads with an array of micro devices on a carrier substrate. In an embodiment, a mass transfer tool manipulator assembly includes a tip-tilt-z flexure, an actuator assembly, and a micro pick up array mount having one or more displacement sensors integrated with one or more compliant elements. For example, the displacement sensors may be strain gauges attached to high strain regions of the compliant elements. In this manner, the displacement sensors may be used to sense deformation of the compliant elements when an array of electrostatic transfer heads contact an array of micro devices. In an embodiment, based on feedback from the displacement sensor(s), the actuator assembly of the mass transfer tool manipulator assembly may adjust a spatial orientation of the micro pick up array mount to change a center of pressure on the micro pick up array mount. Thus, the mass transfer tool manipulator assembly may facilitate active alignment of an array of electrostatic transfer heads mounted on the micro pick up array mount with an array of micro devices based on a closed feedback loop. Active alignment may increase the transfer rate of micro devices, since fine-alignment may be accomplished while picking up, and similarly while releasing, the micro devices.

In another aspect, embodiments of the invention describe systems and methods for the mass transfer of micro devices using a tip-tilt-z flexure coupled with an actuator assembly of a mass transfer tool manipulator assembly. In an embodiment, the tip-tilt-z flexure imparts a reactive load on the actuator assembly to smooth motion of a micro pick up array mount during adjustment by the actuator assembly. In an embodiment, the tip-tilt-z flexure imparts a restorative load on the micro pick up array mount to pick up an array of micro devices from a carrier substrate. Thus, the mass transfer tool manipulator assembly may facilitate contact with, and pick up, of an array of micro devices using an array of electrostatic transfer heads without damaging the micro devices or the electrostatic transfer heads.

In another aspect, embodiments of the invention describe a manner for the mass transfer of an array of pre-fabricated micro devices with an array of electrostatic transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 20 μm by 20 μm pitch, or 5 μm by 5 μm pitch. At these densities a 6 inch substrate, for example, may accommodate approximately 165 million micro LED devices with a 10 μm by 10 μm pitch, or approximately 660 million micro LED devices with a 5 μm by 5 μm pitch. A mass transfer tool manipulator assembly including an array of electrostatic transfer heads matching an integer multiple of the pitch of the corresponding array of micro LED devices may be used to pick up and transfer the array of micro LED devices to a receiving substrate. In this manner, micro LED devices may be integrated and assembled into heterogeneously integrated systems, including substrates of any size ranging from micro displays to large area displays, and at high transfer rates. For example, a 1 cm by 1 cm array of electrostatic transfer heads may pick up and transfer more than 100,000 micro devices, with larger arrays of electrostatic transfer heads being capable of transferring more micro devices.

Referring to FIG. 1, a perspective view illustration of a mass transfer tool is shown in accordance with an embodiment of the invention. As illustrated, mass transfer tool 100 may include a mass transfer tool manipulator assembly 102 for picking up an array of micro devices from a carrier substrate held by a carrier substrate holder 104 and for transferring and releasing the array of micro devices onto a receiving substrate held by a receiving substrate holder 106. Operation of mass transfer tool 100 and mass transfer tool manipulator assembly 102 may be controlled at least in part by a computer system 108. In an embodiment, computer system 108 may control the operation of mass transfer tool manipulator assembly 102 based on feedback signals received from various sensors on a micro pick up array mount coupled with the mass transfer tool manipulator assembly 102 as described in further detail below.

In an embodiment, components and subassemblies of mass transfer tool 100 and mass transfer tool manipulator assembly 102 may be moved relative to each other. For example, mass transfer tool 100 and mass transfer tool manipulator assembly 102 may adjust spatial relationships between components in order to facilitate transferring an array of micro devices with an array of electrostatic transfer heads. Such adjustments may require precise movements in multiple degrees of freedom. For example, mass transfer tool manipulator assembly 102 may include an actuator assembly for adjusting a micro pick up array mount with at least three degrees of freedom, e.g., tipping, tilting, and movement in a z direction. Similarly, the carrier substrate holder 104 may be moved by an x-y stage 110 of mass transfer tool 100, having at least two degrees of freedom, e.g., along orthogonal axes within a horizontal plane. Thus, in an embodiment, an array of electrostatic transfer heads supported by mass transfer tool manipulator assembly 102 and an array of micro devices supported by a carrier substrate held by carrier substrate holder 104 may be precisely moved relative to each other with five degrees of freedom. However, mass transfer tool 100 and mass transfer tool manipulator assembly 102 may include additional actuators that provide more degrees of freedom between the array of micro devices and the array of electrostatic transfer heads, or between other components of the system. For example, mass transfer tool manipulator assembly 102 may be mounted on an x-y stage that moves relative to x-y stage 110, establishing an additional two degrees of freedom between the array of electrostatic transfer heads supported by mass transfer tool manipulator assembly 102 and the array of micro devices supported by the carrier substrate held by carrier substrate holder 104.

Figure 2:
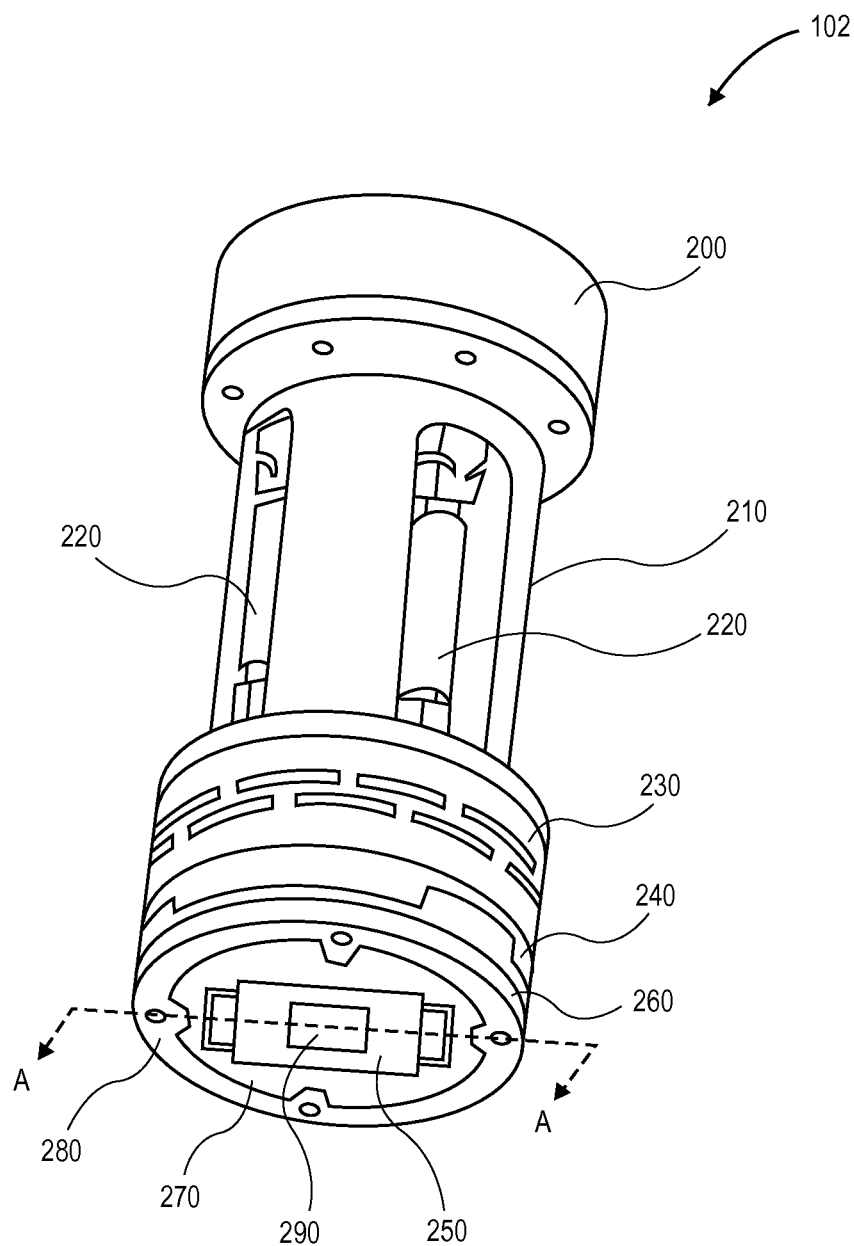
FIG. 2 is a perspective view illustration of a mass transfer tool manipulator assembly holding a micro pick up array in accordance with an embodiment of the invention.

Referring to FIG. 2, a perspective view illustration of a mass transfer tool manipulator assembly holding a micro pick up array is shown in accordance with an embodiment of the invention. FIG. 2 presents an overview of the structural components of an embodiment of mass transfer tool manipulator assembly 102. Mass transfer tool manipulator assembly 102 may include a housing 210 coupled with a mass transfer tool mount 200 of mass transfer tool 100. Housing 210 may have a columnar construction coupled with a tip-tilt-z flexure 230. An actuator assembly 220 may be wholly or partially contained within housing 210, and furthermore, actuator assembly 220 may be coupled with tip-tilt-z flexure 230 through a distribution plate 240. Distribution plate 240 may also be coupled with a micro pick up array mount 250. In an embodiment, micro pick up array mount 250 may be coupled with distribution plate 240 through insulation plate 260, e.g., by retaining micro pick up array mount 250 directly on insulation plate 260. In an embodiment, micro pick up array mount 250 may be joined with an intermediate component, e.g., retainer plate 270, which is held against insulation plate 260 by a retaining ring 280. Furthermore, a micro pick up array 290 supporting an array of electrostatic transfer heads may be integrated with micro pick up array mount 250.

Figure 3:
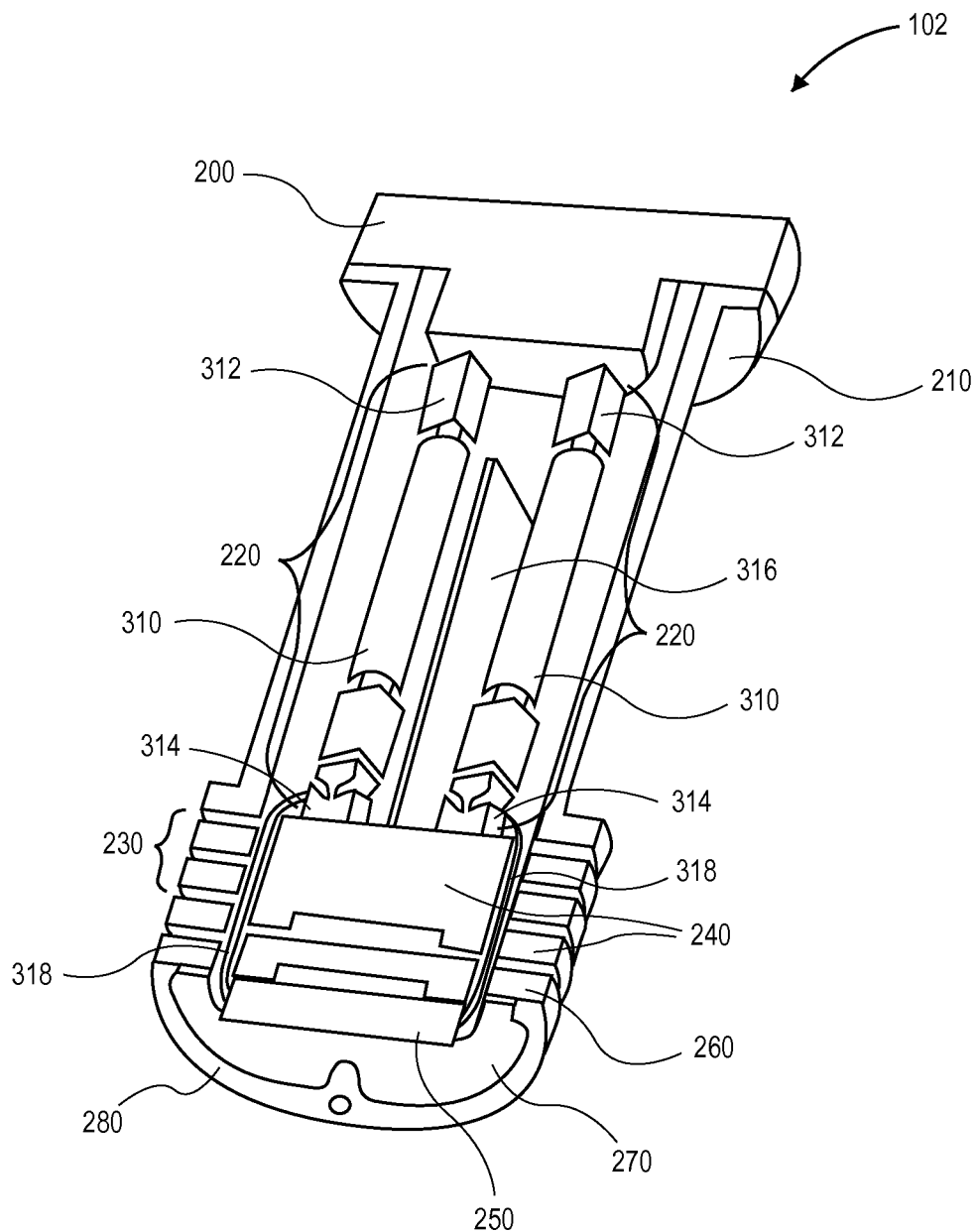
FIG. 3 is a cross-sectional perspective view illustration of a mass transfer tool manipulator assembly, taken about section line A-A of FIG. 2, in accordance with an embodiment of the invention.

Referring to FIG. 3, a cross-sectional perspective view illustration of a mass transfer tool manipulator assembly, taken about section line A-A of FIG. 2, is shown in accordance with an embodiment of the invention. FIG. 3 presents more detail of the mechanical interaction between structural components of an embodiment of mass transfer tool manipulator assembly 102. For example, actuator assembly 220 may include one or more actuators 310 having a first actuator attachment 312 that may be fixedly coupled with housing 210 and/or mass transfer tool mount 200. Actuator 310 may further include second actuator attachment 314 moveable relative to first actuator attachment 312. As described above, second actuator attachment 314 may further be fastened with distribution plate 240. Thus, actuation of actuator 310 may cause relative movement between distribution plate 240 and housing 210.

Actuation of actuator 310 may therefore have at least two results. First, since micro pick up array mount 250 may be directly or indirectly coupled with distribution plate 240, actuation of actuator 310 may change a spatial relationship between micro pick up array mount 250, or micro pick up array 290 joined with micro pick up array mount 250, and housing 210. Second, since distribution plate 240 and housing 210 may be coupled with opposite ends of tip-tilt-z flexure 230, actuation of actuator 310 may apply tensile, compressive, and/or torsional loads to tip-tilt-z flexure 230 as distribution plate 240 moves relative to housing 210.

In an embodiment, insulation plate 260 may be used to thermally isolate micro pick up array mount 250 from other components of mass transfer tool manipulator assembly 102. For example, insulation plate 260 may be placed between micro pick up array mount 250 and actuator assembly 220, or other components of mass transfer tool manipulator assembly 102. Furthermore, contact between insulation plate 260 and micro pick up array mount 250 or other components of mass transfer tool manipulator assembly 102 may be minimized by limiting contact area between the components. For example, insulation plate 260 may be coupled with distribution plate 240 using insulating posts connected to the components with fasteners, rather than coupling the components using a conductive coupling, such as a welded seam.

In an embodiment, insulation plate 260 may be formed from a material exhibiting low thermal conductivity, e.g., thermal conductivity below about 1.5 W/m*° C. when heated to 200 degrees Celsius. For example, insulation plate 260 may be formed from an opaque fused quartz material, or another material having insulating properties. In an embodiment, insulation plate 260 is formed from a high purity opaque fused quartz material containing uniformly distributed microscopic bubbles of less than about 20 micron, e.g., "Pyro-LD80" manufactured by Pyromatics Corp. headquartered in Mentor, Ohio. Thus, insulation plate 260 may function as a thermal barrier to thermally isolate components of mass transfer tool manipulator assembly 102 such as actuators 310 (e.g. piezoelectric actuators) and sensing module 316 from a heating element used to heat the micro pick up array 290 supporting the array of electrostatic transfer heads as described in further detail below.

In an embodiment, retainer plate 270 and micro pick up array mount 250 may be formed from materials have similar thermal expansion coefficients. For example, micro pick up array mount 250 may be formed from silicon and retainer plate 270 may be formed from a controlled-expansion nickel alloy, e.g., low expansion "Alloy 39". Alloy 39 is a controlled-expansion alloy that in an embodiment includes a chemical composition of 0.05 C, 0.40 Mn, 0.25 Si, 39.00 Ni, Bal. Fe. By comparison, Alloy 39 exhibits a coefficient of thermal expansion of about 2 (×10-6/° C.) near 25° C., while silicon exhibits a linear coefficient of thermal expansion of about 3 (×10-6/° C.) near the same temperature. Thus, micro pick up array mount 250 and retainer plate 270 need not have identical thermal expansion characteristics, but those components may expand and contract within the same order of magnitude when subjected to changing temperatures.

In an embodiment, retaining ring 280 may be fastened to insulation plate 260, or directly to distribution plate 240, using clips, threaded fasteners, or other known fastening mechanisms. Furthermore, retaining ring 280 may include one or more tabs or lips that press against micro pick up array 290 or retainer plate 270 to clamp retainer plate 270 against insulation plate 260 and couple micro pick up array mount 250 with distribution plate 240. Other manners of retaining micro pick up array mount 250 may be used. For example, retainer plate 270 may be bonded directly to insulation plate 260 using known adhesive or thermal bonding techniques, e.g., welding or soldering.

Figure 4A:
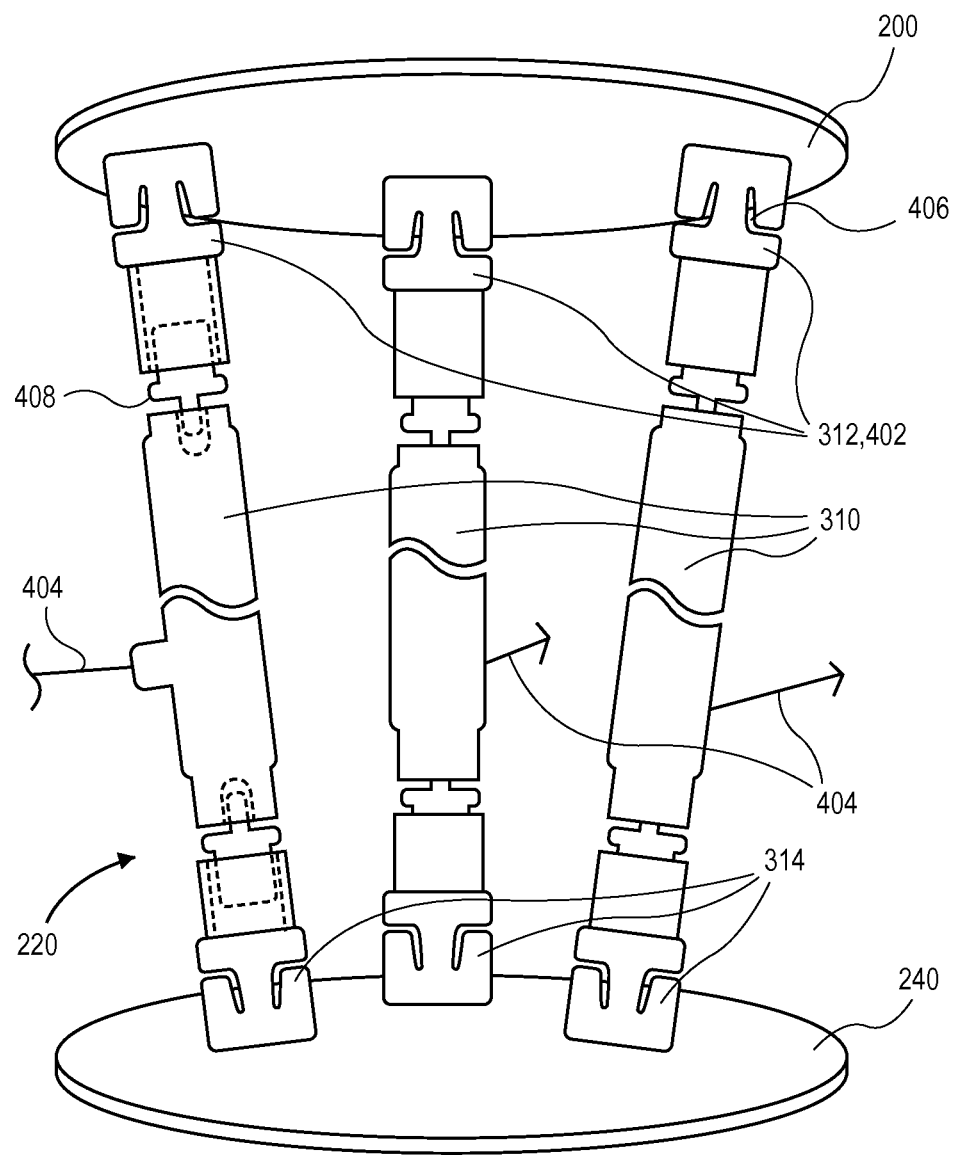
FIG. 4A is a side view illustration of an actuator assembly having an actuator and a flexure attachment in accordance with an embodiment of the invention.

Referring to FIG. 4A, a side view illustration of an actuator assembly having an actuator and a flexure attachment is shown in accordance with an embodiment of the invention. In an embodiment, actuator assembly 220 includes at least one actuator 310 that creates motion between first actuator attachment 312 and second actuator attachment 314. For example, actuator assembly 220 may include three linear actuators that each move first actuator attachment 312 relative to second actuator attachment 314 in a single linear direction. Thus, actuator assembly 220 may create a total of at least two degrees of freedom between mass transfer tool mount 200 coupled with first actuator attachment 312 and distribution plate 240 coupled with second actuator attachment 314. More particularly, actuator assembly 220 may tip and tilt distribution plate 240 relative to mass transfer tool mount 200. The quantity and type of actuator 310, may be varied in actuator assembly 220 to change the degrees of freedom and/or range of motion between mass transfer tool mount 200 and distribution plate 240, e.g., actuator 310 may be a rotary actuator instead of a linear actuator. Accordingly, in an embodiment, actuator assembly 220 may provide a third degree of freedom in a z direction by extending each of three linear actuators simultaneously. However, in another embodiment, additional degrees of freedom may be provided by actuators external to mass transfer tool manipulator assembly 102, such as by a single linear actuator of mass transfer tool 100 that may move mass transfer tool mount 200 in a z direction. Similarly, as described above, x-y stage 110 may provide additional degrees of freedom between components of mass transfer tool 100 and mass transfer tool manipulator assembly 102. Thus, in an embodiment, actuation of distribution plate 240 may not depend solely on movement of actuator assembly 220, but it may also depend on external actuators.

In an embodiment, actuator 310 may be a piezoelectric actuator. Although other linear actuators may be used, e.g., hydraulic, pneumatic, or electromechanical actuators, a piezoelectric actuator may exhibit fine positioning resolution through relatively short movements when controlled by signals communicated through actuator lead 404. In an embodiment, actuator 310 may be a piezoelectric actuator with a range of motion of about 30 microns.

In an embodiment, first actuator attachment 312 may include first flexure attachment 402. First flexure attachment 402 may include one or more flexure relief 406. Flexure relief 406 may be configured to provide flexibility to first flexure attachment 402 in directions other than the direction of motion of actuator 310. For example, flexure relief 406 may include a channel machined in first flexure attachment 402 to provide flexibility in a direction orthogonal to the length of actuator 310. Furthermore, first flexure attachment 402 may provide movement without hysteresis to counteract any backlash that may be present in actuator 310. Actuator 310 and first flexure attachment 402 may be coupled with a coupling shaft 408 having ends that engage bores formed in actuator 310 and first flexure attachment 402. Coupling shaft 408 may be allowed to float within the bores, or be rigidly fixed therein using known bonding and clamping methods.

Figure 4B:
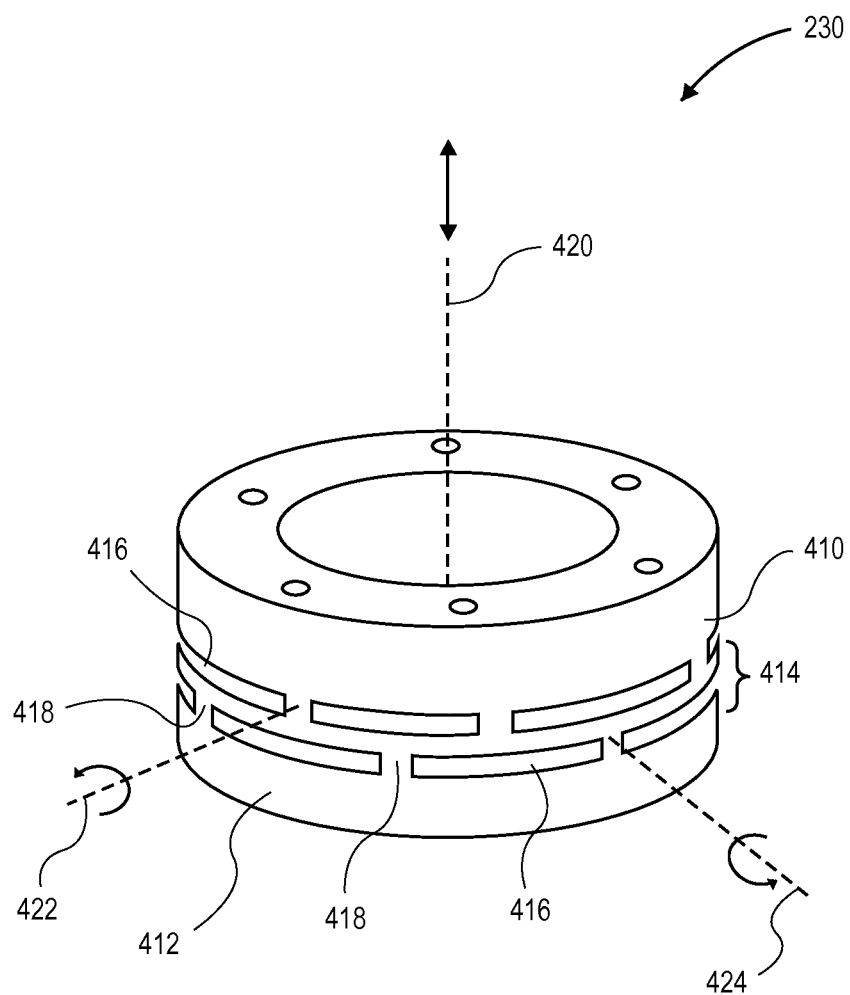
FIG. 4B is a perspective view of a tip-tilt-z flexure of a mass transfer tool manipulator assembly in accordance with an embodiment of the invention.

Referring to FIG. 4B, a perspective view of a tip-tilt-z flexure of a mass transfer tool manipulator assembly is shown in accordance with an embodiment of the invention. Tip-tilt-z flexure 230 may include a top flexure component 410 and a bottom flexure component 412. In an embodiment, top flexure component 410 and bottom flexure component 412 are connected by a flexible coupling 414. Flexible coupling 414 may have numerous configurations, for example, flexible coupling 414 may include a beam coupling or a helical coupling having one or more radial slot 416 through a portion of a sidewall of tip-tilt-z flexure 230. In an embodiment, the radial slots 416 may be separated from each other by one or more partition 418. Alternatively, radial slot 416 may be a single helically formed slot through tip-tilt-z flexure 230.

Flexible coupling 414 may be configured to allow top flexure component 410 and bottom flexure component 412 to move relative to each other along a z axis 420 and about a tip axis 422 and a tilt axis 424. Resultantly, when top flexure component 410 couples with mass transfer tool mount 200 through a rigid housing 210, and bottom flexure component 412 couples with actuator assembly 220 through a rigid distribution plate 240, motion between top flexure component 410 and bottom flexure component 412 mirrors the motion between mass transfer tool mount 200 and distribution plate 240. Thus, tip-tilt-z flexure 230 allows actuator assembly 220 to adjust distribution plate 240, as well as micro pick up array mount 250 and/or micro pick up array 290 coupled with distribution plate 240, relative to mass transfer tool mount 200.

In addition to allowing the actuation of micro pick up array mount 250 and/or micro pick up array 290 coupled with distribution plate 240, tip-tilt-z flexure 230 may facilitate such actuation in numerous ways. For example, a stiffness of flexible coupling 414 of tip-tilt-z flexure 230 may be tuned to permit micro pick up array mount 250 to deform when contacting a micro device on a carrier substrate. Also, the stiffness of flexible coupling 414 of tip-tilt-z flexure 230 may be tuned to smooth movement of actuator assembly 220. Furthermore, the stiffness of flexible coupling 414 of tip-tilt-z flexure 230 may be tuned to provide a pick up force that retracts a micro device gripped by an electrostatic transfer head 703 from a carrier substrate.

In an embodiment, flexible coupling 414 may be stiffer than the compliant element of micro pick up array mount 250 described in further detail below. Matching stiffness between flexible coupling 414 and the compliant element in this way may permit the compliant element to deform as needed when an array of electrostatic transfer heads contacts an array of micro devices. That is, rather than having the contact load absorbed by flexible coupling 414, the contact load may instead be absorbed by a compliant element. Furthermore, the compliant element may deform under such load and the deformation may be sensed by displacement sensor 518 integrated with the compliant element and used as feedback to adjust actuator assembly 220.

In an embodiment, flexible coupling 414 may provide a reactive load to distribution plate 240 as actuator assembly 220 moves distribution plate 240. For example, in the case of tilting distribution plate 240 by actuator assembly 220 having three actuators, the kinematics of each actuator may be slightly mismatched, resulting in unwanted jerkiness or torsion, e.g., yawing, of distribution plate 240. The stiffness of flexible coupling 414 may be tuned to counteract this kinematic mismatch and resist unwanted movement. For example, in an embodiment, flexible coupling 414 having beam coupling as described above, i.e., having partitions 418 between radial slots 416, a torsional stiffness of flexible coupling 414 may be sufficiently high to prevent rotation about z axis 420 and thereby limit motion of distribution plate 240 entirely to tipping and tilting about tip axis 422 and tilt axis 424.

In an embodiment, flexible coupling 414 may be expanded in length under a tensile load applied by actuator assembly 220, but the work exerted on flexible coupling 414 may result in potential energy being stored to cause a restorative load after deactivation of actuator assembly 220. In other words, flexible coupling 414 may act as a tension spring to pull on distribution plate 240, and micro pick up array mount 250 coupled with distribution plate 240, after removing the biasing load of actuator assembly 220. In the case where the array of electrostatic transfer heads 703 electrostatically grip an array of micro devices attached to a carrier substrate, the restorative load generated by flexible coupling 414 may be greater than the load required to pick up the array of micro devices from the carrier substrate, i.e., the breaking pressure. For example, the breaking pressure may be expected to be about two atmospheres in an embodiment, and thus, flexible coupling 414 may be tuned to generate a restorative load equivalent to a pressure higher than two atmospheres when extended. Thus, after the array of electrostatic transfer heads have been made to grip an array of micro devices, actuator assembly 220 may be deactivated and the pick up pressure may be provided by restorative loading from flexible coupling 414.

In an embodiment, micro pick up array mount 250 includes sensors that provide feedback signals to a position sensing module 316 and/or computer system 108 through one or more electrical connections, such as flex circuit 318. As described below, feedback may include analog signals from displacement sensors that are used in a control loop to regulate actuation of actuator 310, and therefore, spatial orientation of micro pick up array mount 250. Position sensing module 316 may be located nearby micro pick up array mount 250 to reduce signal degradation by limiting a distance that analog signals must travel from a displacement sensor to position sensing module 316. Position sensing module 316 may also be located on an opposite side of insulation plate 260 to reduce heat transfer from micro pick up array mount 250 to position sensing module 316 and actuators 310. Maintaining thermal isolation between position sensing module 316 and micro pick up array mount 250 may reduce signal distortion caused by heat effects on position sensing module 316. Maintaining thermal isolation between actuators 310, such as piezoelectric actuators, and micro pick up array mount 250 may protect against thermal drift of the actuators 310 and consequently the ability of the mass transfer tool manipulator assembly 102 to accurately adjust the spatial orientation of the micro pick up array mount 250 supporting the array of micro devices.

FIGS. 5A-6 and FIGS. 8-12 illustrate alternative embodiments of a micro pick up array mount 250 that may be coupled with distribution plate 240 to allow the spatial orientation of micro pick up array mount 250 to be adjusted when actuator assembly 220 adjusts distribution plate 240. Each of the embodiments enable a spatial orientation of an electrostatic transfer head to be adjusted through articulation of micro pick up array mount 250 or a micro pick up array 290. In an embodiment, micro pick up array mount 250 may include any of the auto-aligning structures illustrated and described in related U.S. application Ser. Nos. 13/715,557 and 13/715,591, which are hereby incorporated by reference.

Figure 5A:
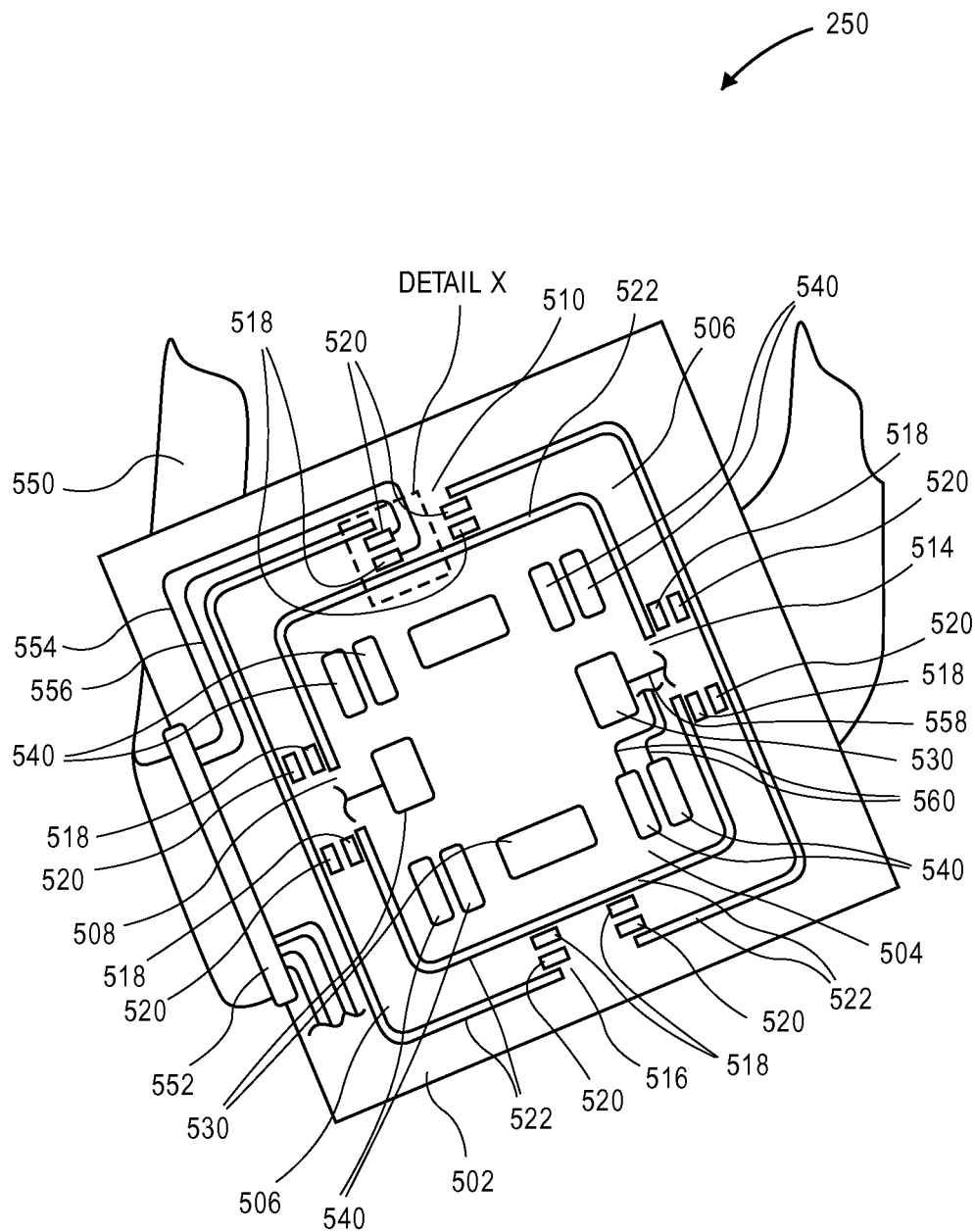
FIG. 5A is a perspective view of a micro pick up array mount having a displacement sensor integrated with a compliant element in accordance with an embodiment of the invention.

Referring to FIG. 5A, a perspective view of a micro pick up array mount having a displacement sensor integrated with a compliant element is shown in accordance with an embodiment of the invention. For the purpose of reference, the illustrated view may be referred to as a "front side" or "front face" of micro pick up array mount 250. In an embodiment, micro pick up array mount 250 includes base 502 and pivot platform 504. In an embodiment, base 502 surrounds all or a part of pivot platform 504. For example, base 502 may extend laterally around pivot platform 504. In an alternative embodiment, base 502 does not surround pivot platform 504. Base 502 and pivot platform 504 may be interconnected by one or more compliant elements. For example, in the illustrated embodiment, a compliant element may be represented by beam 506. Beam 506 may connect with base 502 and pivot platform 504 at one or more pivot locations, such as inner pivot 508, 514 and outer pivot 510, 516. In an embodiment, inner pivots 508, 514 and outer pivots 510, 516 may be located on edges of base 502 and pivot platform 504 that are orthogonal to each other.

In accordance with embodiments of the invention, micro pick up array mount 250 may be formed from one or more portions or parts. For example, in an embodiment, base 502, pivot platform 504, and one or more compliant elements (e.g. beam 506) may be formed from a silicon wafer to produce distinct regions. More specifically, known processes, such as deep etching, laser cutting, etc. may be used to form channels 522. In at least one embodiment, channels 522 may therefore define the structure of micro pick up array mount 250 by providing separations between, e.g., base 502, beam 506, and pivot platform 504 regions. For example, channels 522 may create a separation of about one hundred microns between base 502 and beam 506, as well as between beam 506 and pivot platform 504. Materials other than silicon may be utilized for the micro pick up array mount 250, based on the ability of a material to deflect under applied load, thermal stability, and minimal spring mass. For example, beside silicon, suitable material choices for forming a micro pick up array mount 250 may include, but are not limited to, silicon carbide, aluminum nitride, stainless steel, and aluminum.

Beam 506 may extend from inner pivot 508 to outer pivot 510 laterally around pivot platform 504. More particularly, beam 506 may conform to base 502 and pivot platform 504 by fitting between those components and at least partially filling a void between those components. In an embodiment, the lateral extension of beam 506 provides a lever arm that allows for bending and torsion in beam 506, inner pivots 508, 514, and outer pivots 510, 516, when forces are applied to pivot platform 504 or to a micro pick up array 290 mounted on pivot platform 504. More specifically, when a force is applied to pivot platform 504, such as when an electrostatic transfer head on a mounted micro pick up array 290 contacts a micro device on a carrier substrate, pivot platform 504 may deflect relative to base 502. This deflection may be accompanied by the development of one or more high strain areas, as represented by dotted line region Detail X, near outer pivot 510.

Similar strain regions may develop near inner pivots 508, 514 and outer pivot 516 depending on the location that force is applied to pivot platform 504.

In an embodiment, beam 506 stiffness may be selected to facilitate both pick up and placement of a micro device from a carrier substrate or a receiving substrate. For example, beam 506 stiffness may be tuned to ensure that electrostatic transfer heads on pivot platform 504 are not damaged after contacting micro devices on a carrier substrate, or after micro devices gripped by electrostatic transfer heads contact a receiving substrate. That is, beam 506 stiffness may permit beam deformation sufficient to allow pivot platform 504 to deflect through a contact range. For example, in an embodiment, pivot platform 504 may be expected to deflect upward at least thirty microns when electrostatic transfer heads contact an array of micro devices with a load less than the load required to damage electrostatic transfer heads.

In addition, beam 506 stiffness may be tuned to prevent plastic deformation of beam 506 during pick up of a micro device from a carrier substrate. For example, when an electrostatic transfer head grips a micro device on a carrier substrate, retraction of the mass transfer tool manipulator assembly 102 may move base 502 upward relative to pivot platform 504 associated with the electrostatic transfer head. In essence, micro pick up array mount 250 acts like a tension spring pulling the array of micro devices gripped by the array of electrostatic transfer heads. In an embodiment, beam 506 stiffness allows such movement without causing plastic deformation in beam 506. For example, in an embodiment in which an expected amount of about two atmospheres of pressure is required to lift a micro device from a carrier substrate, beam 506 resists at least two atmosphere of pressure applied to pivot platform 504 prior to being plastically deformed.

In an embodiment, one or more displacement sensors 418 may be integrated with beam 506 at or near a high strain area. Displacement sensors 418 may be capable of sensing beam 506 displacement resulting from loads applied to portions of micro pick up array mount 250, such as pivot platform 504. For example, displacement sensors 418 may detect movement of beam 506 directly, or it may detect internal deformation to infer movement of beam 506.

Figure 5B:
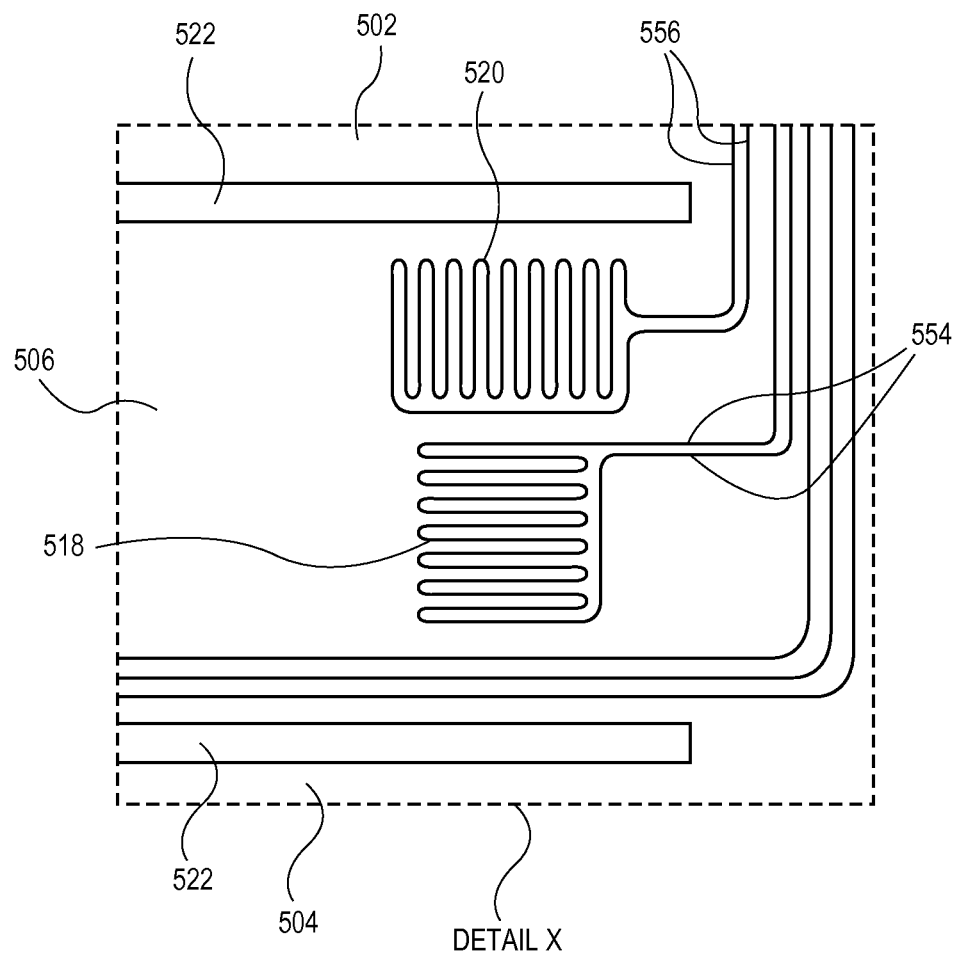
FIG. 5B is a plan view of a displacement sensor integrated with a compliant element of a micro pick up array mount, taken from detail X of FIG. 5A, in accordance with an embodiment of the invention.

Referring to FIG. 5B, a plan view of a displacement sensor integrated with a compliant element of a micro pick up array mount, taken from Detail X of FIG. 5A, is shown in accordance with an embodiment of the invention. In an embodiment, displacement sensor 518 may be a strain gauge that measures deformation of beam 506. The strain gauge may exhibit an electrical resistance that varies with material deformation. More specifically, the strain gauge may be configured to deform when beam 506 deforms. That is, the strain gauge design may be selected based on environmental and operating conditions associated with the transfer of micro devices from a carrier substrate, to achieve the necessary accuracy, stability, cyclic endurance, etc. Accordingly, the strain gauge may be formed from various materials and integrated with beam 506 in numerous ways to achieve this goal. Several such embodiments are described below.

A strain gauge may be separately formed from beam 506 and attached thereto. In an embodiment, the strain gauge includes an insulative flexible backing that supports a foil formed from polysilicon and electrically insulates the foil from beam 506. The foil may be arranged in a serpentine pattern, for example. An example of an attachable strain gauge is a Series 015DJ general purpose strain gauge manufactured by Vishay Precision Group headquartered in Malvern, Pa. A strain gauge that is separately formed from beam 506 may be attached to beam 506 using numerous processes. For example, the strain gauge backing may be directly attached to beam 506 with an adhesive or other bonding operation. More specifically, strain gauge backing may be fixed to a surface of beam 506 using solder, epoxy, or a combination of solder and a high-temperature epoxy.

In another embodiment, a strain gauge may be formed on beam 506 in a desired pattern, such as a serpentine pattern. In an embodiment, a strain gauge may be formed directly on beam 506 using a deposition process. For example, constantan copper-nickel traces may be sputtered directly on beam 506 in a serpentine pattern. The dimensions of a strand of a sputtered strain gauge having a serpentine pattern may be about 8 micron width with about an 8 micron distance between strand lengths and may be deposited to a thickness of about 105 nanometers.

In another embodiment, the material of beam 506 may be modified to form an integrated strain gauge. More specifically, beam 506 may be doped with a piezoresistive material to create a strain gauge within beam 506. As an example, the surface of beam 506 may be doped with silicon. The doped material may be in a serpentine pattern, having dimensions that vary with an applied strain. Thus, the strain gauge may be fully integrated and physically indistinct from the remainder of beam 506.

In an embodiment, displacement sensor 518 may be a strain gauge on beam 506 having a pattern (e.g. serpentine) of lengthwise strands that align in a direction of anticipated strain. For example, beam 506 may be expected to see compressive or tensile loads in a high strain area that aligns with channels 522 and thus the lengthwise strands of displacement sensor 518 may be parallel with channels 522. However, in an embodiment of micro pick up array mount 250 having compliant elements that see primary strain planes in other directions, displacement sensor 518 may be oriented to detect such strains.

During the transfer of micro devices from a carrier substrate, beam 506 and displacement sensor 518 may be subjected to elevated temperatures, and thus, temperature compensation may be necessary. In an embodiment, displacement sensor may be self-temperature compensated. More specifically, strain gauge material may be chosen to limit temperature-induced apparent strain over the operating conditions of the transfer process. However, in an alternative embodiment, other manners for temperature compensation may be used. For example, temperature compensation may be achieved using a dummy gauge technique.

Still referring to FIG. 5B, in an embodiment, a dummy gauge technique utilizes a reference strain gauge 520 to compensate for displacement sensor 518. More particularly, reference strain gauge 520 may be located near displacement sensor 518 in the same area of strain. While strands of displacement sensor 518 may align with the direction of applied strain, strands of reference strain gauge 520 may extend orthogonally to the strands of displacement sensor 518 and to the direction of applied strain. Alternatively, reference strain gauge 520 may be located in a non-strain area of micro pick up array mount 250, apart from displacement sensor 518, which is located in a high strain area of beam 506. For example, reference strain gauge 520 may be located on base 502 or pivot platform 504. Therefore, displacement sensor 518 may be configured to detect strain applied to beam 506 and reference strain gauge may be configured to detect strain from thermal effects on micro pick up array mount 250. Accordingly, a comparison of strain in both strain gauges may be used to determine, and compensate for, strain related to thermal expansion of beam 506.

Referring again to FIG. 5A, in an embodiment, reference strain gauge 520 and displacement sensor 518 may be wired into adjacent legs of a half Wheatstone bridge to cancel out temperature effects between displacement sensor 518 and reference strain gauge 520. Each displacement sensor 518 and reference strain gauge 520 may form a half Wheatstone bridge to sense strain in high strain areas near inner pivots 508, 514 or outer pivots 510, 516. However, each inner pivot 508, 514 and outer pivot 510, 516 may include a second high strain area, opposite from the first high strain area, and near a second lateral edge of the pivot defined by channels 522. Another displacement sensor 518, or a pair of displacement sensor 518 and reference strain gauge 520, may be located in this second high strain area to sense deformation. Furthermore, both pairs of displacement sensor 518 and reference strain gauge 520 may be wired together in a full Wheatstone bridge that may be monitored to determine the material strain near the inner pivots 508, 514 and outer pivots 510, 516. As described below, monitoring these strain signals may be used to infer the pressure applied to pivot platform 504. Furthermore, strain signals may be used by a control algorithm to determine the required tip, tilt, and z (orthogonal to pivot platform face) movement required to evenly distribute pressure across pivot platform 504.

Other types of sensors may be used to sense deformation or displacement in a compliant element of micro pick up array mount 250. For example, different strain gauge types, including capacitive strain gauges and strain gauges that utilize fiber optic sensing may be used to sense beam 506 deformation. Alternatively, displacement of either a compliant element, or another component of micro pick up array mount 250, such as pivot platform 504, may be measured directly. In an embodiment, laser interferometers may be used to sense displacement of a compliant element or pivot platform 504. In another embodiment, capacitive displacement sensors may be used to sense displacement of a compliant element or pivot platform 504. Thus, numerous manners may be selected to measure and provide feedback related to displacement of a pivot platform 504 or compliant element. In an embodiment, selection may be guided by trade-offs such as cost, required accuracy, and environmental considerations. For example, the ability to compensate for thermal effects on a displacement sensor 518 may be one selection criteria.

In an embodiment, micro pick up array mount 250 includes one or more pivot platform operational voltage contacts 530 on pivot platform 504. Pivot platform operational voltage contacts 530 may function to transfer an operating voltage to an array of electrostatic transfer heads on micro pick up array 290 when operably connected with micro pick up array mount 250. In an embodiment, pivot platform operational voltage contacts 530 may be formed using a suitable technique such as, but not limited to, sputtering or electron beam evaporation of a conductive material (e.g., metal) onto a surface of pivot platform 504.

In an embodiment, micro pick up array mount 250 may include one or more bonding sites for mounting micro pick up array 290. In an embodiment, a bonding site includes one or more clamp electrodes 540 located on pivot platform 504. More particularly, clamp electrodes 540 may be located on the same surface of pivot platform 504 as pivot platform operating voltage contact 530. Clamp electrodes 540 may be constructed to secure or clamp micro pick up array 290 using electrostatic principles. For example, clamp electrodes 540 may include one or more conductive pads covered by a dielectric layer. In accordance with the principles of electrostatic grippers, when the conductive pads are maintained at a voltage and placed adjacent to metal or semiconductor film clamp areas on micro pick up array 290, an electrostatic force clamps micro pick up array 290 to micro pick up array mount 250. Here, the term adjacent may refer to the conductive pads being separated from the clamp areas only by a thin dielectric layer.

The components on the front face of micro pick up array mount 250 may be placed in electrical connection with other components of mass transfer tool 100 and mass transfer tool manipulator assembly 102 through various leads. For example, front flex circuit 550 may extend from external components of mass transfer tool 100 and mass transfer tool manipulator assembly 102 to electrically connect with front flex circuit connector 552 on a face or edge of base 502. Front flex circuit 550 may be, for example, a multi-conductor ribbon cable and front flex circuit connector 552 may be a mating connector. Furthermore, front flex circuit connector 552 may include terminal contacts from which various traces originate and extend to components on the front face of micro pick up array mount 250.

As an example, displacement sensor 518 may be electrically connected with front flex circuit connector 552 through one or more displacement sensor trace 554. More particularly, displacement sensor 518 may be electrically connected with two traces, an input and an output trace (FIG. 5B), that connect with separate terminal contacts of mating connector. The one or more traces are graphically depicted as a single line in FIG. 5A, and furthermore, traces are either omitted or shown with broken lines to indicate that the number of actual leads has been portrayed schematically for the sake of brevity in illustration.

Similarly, reference strain gauge 520 may be electrically connected with front flex circuit connector 552 through one or more reference strain gauge trace 556. Pivot platform operating voltage contact 530 may be electrically connected with front flex circuit connector 552 through one or more operating voltage trace 558. Clamp electrode 540 may be electrically connected with front flex circuit connector 552 through one or more clamp electrode trace 560. In an embodiment, traces may be formed directly on micro pick up array mount 250 using a suitable technique such as sputtering or e-beam evaporation. In an alternative embodiment, traces may be a wire separate from, or bonded to a surface of, micro pick up array mount 250.

Figure 6:
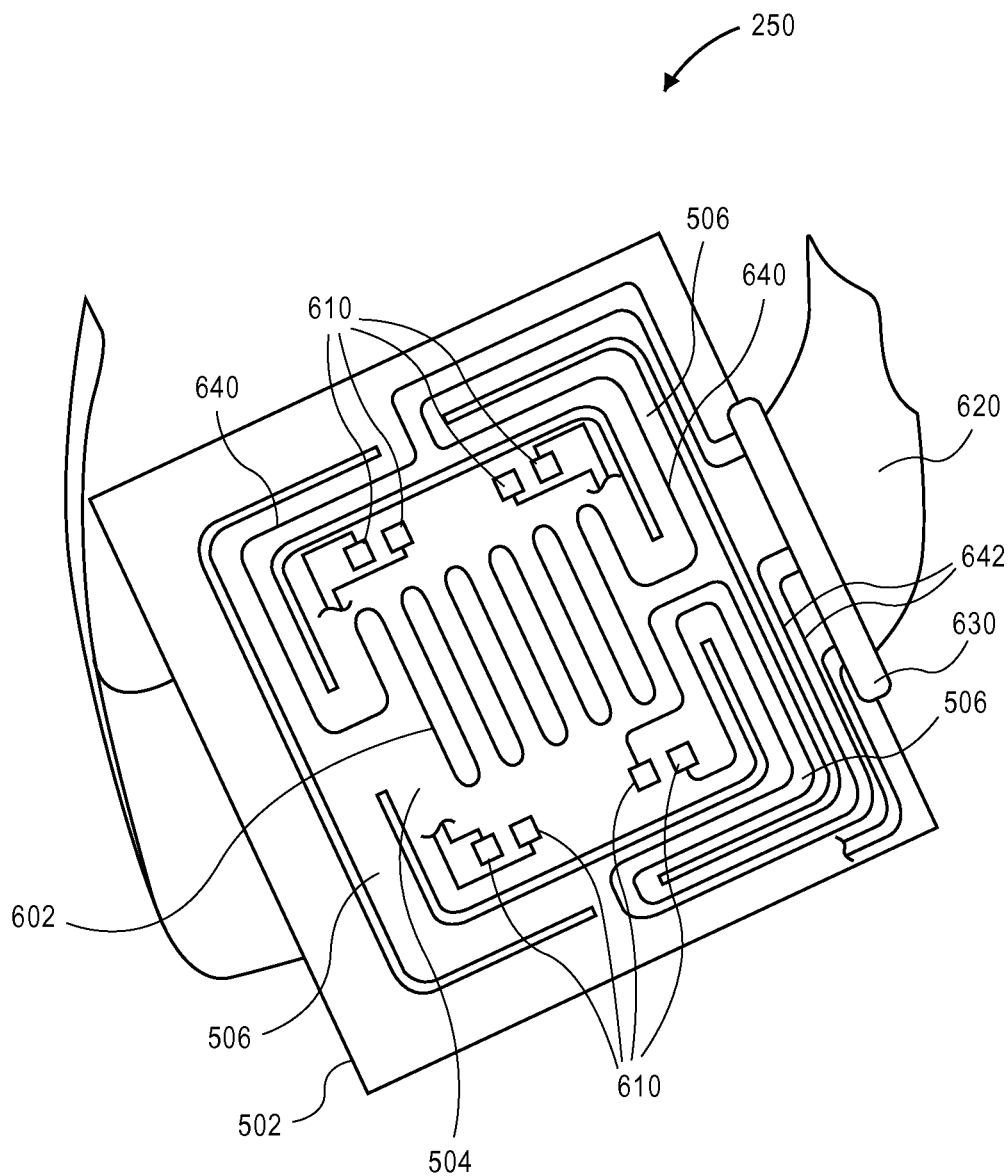
FIG. 6 is a perspective view of a micro pick up array mount having a heating element on a pivot platform in accordance with an embodiment of the invention.

Referring to FIG. 6, a perspective view of a micro pick up array mount having a heating element on a pivot platform in accordance with an embodiment of the invention. For the purpose of reference, the illustrated view may be referred to as a "back side" or "back face" of micro pick up array mount 250. Micro pick up array mount 250 may include one or more heating elements 602 over a back side of pivot platform 504 of micro pick up array mount 250. In an embodiment, heating element 602 may be formed from a resistance alloy, such as a nickel-chromium alloy sputtered on micro pick up array mount 250. Thus, heating element 602 may undergo Joule heating as electrical current passes through it. Therefore, heat may be transferred from heating element 602 to micro pick up array mount 250 and/or micro pick up array 290 joined therewith. In an alternative embodiment, heating element 602 may be a surface mounted resistor based on surface-mount technology that dissipates heat at a rate depending on a current applied to the resistor. In an embodiment, micro pick up array mount may be heated by an external heating component, such as an infrared heating source directed toward pivot platform 504.

In an embodiment, micro pick up array mount 250 includes one or more temperature sensors 610 to sense the temperature of micro pick up array mount 250 or nearby structures, e.g., a micro pick up array 290. For example, temperature sensor 610 may be located on a back side of pivot platform 504 to measure the temperature of the pivot platform 504. For example, temperature sensor 610 may be located in a center of pivot platform 504, a corner of pivot platform 504, or on base 502 or beam 506. Temperature sensor 610 may be a thermistor, thermocouple, or other type of temperature sensor. Furthermore, temperature sensor 610 may be potted or otherwise adhered or mechanically fixed to pivot platform 504.

In accordance with embodiments of the invention, heating element 602 and/or temperature sensor 610 may be located on a front or back side of micro pick up array mount 250. The choice of location may be driven by considerations such as available space and whether the heating element 602 and temperature sensor 610 will interfere with other functions. For example, the components may be placed to avoid disrupting electrical charge in clamp electrode 540 of micro pick up array mount 250 or electrostatic transfer heads of micro pick up array 290. Furthermore, the components may be placed to avoid interfering with bonding of micro pick up array 290 to micro pick up array mount 250. Temperature sensor 610 may be placed to closely approximate the peak temperature of micro pickup array 290. Temperature offsets may be employed as necessary to achieve this approximation.

The components on the back face of micro pick up array mount 250 may be placed in electrical connection with other components of mass transfer tool 100 and mass transfer tool manipulator assembly 102 through various leads. For example, back flex circuit 620 may extend from external components of mass transfer tool 100 and mass transfer tool manipulator assembly 102 to electrically connect with back flex circuit connector 630 mounted on a face or edge of base 502. Back flex circuit 620 may be, for example, a multi-conductor ribbon cable and back flex circuit connector 630 may be a mating connector. Furthermore, back flex circuit connector 630 may include terminal contacts from which various traces originate and extend to components on the back face of micro pick up array mount 250. As such, heating element 602 may be electrically connected with back flex circuit connector 630 through one or more heating trace 640. Temperature sensor 610 may be electrically connected with back flex circuit connector 630 through one or more temperature sensor trace 642. In an embodiment, traces may be formed directly on micro pick up array mount 250 using a suitable technique such as sputtering or e-beam evaporation. In an alternative embodiment, traces may be a wire separate from, or bonded to a surface of, micro pick up array mount 250.

Figure 7:
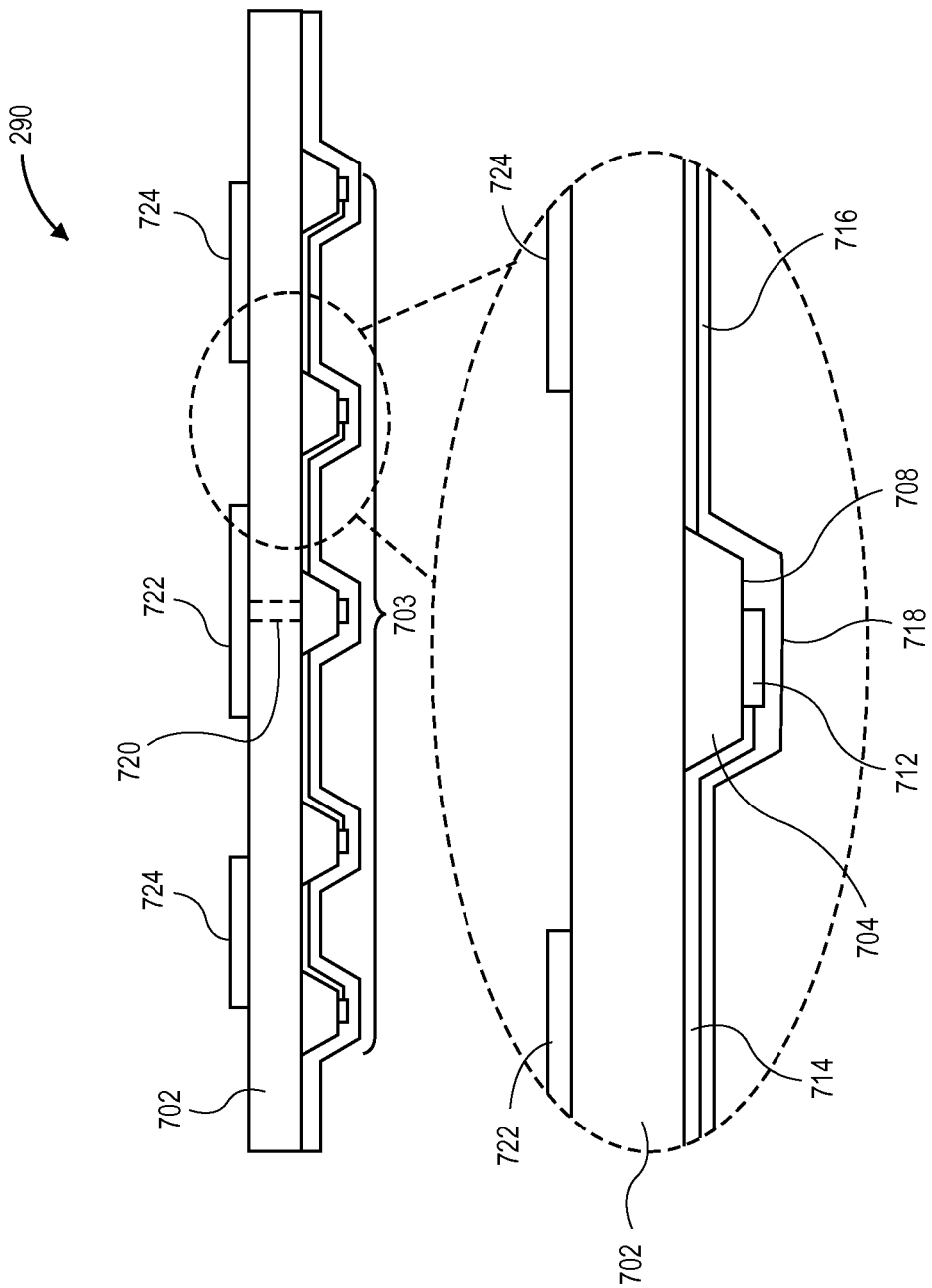
FIG. 7 is a side view of a micro pick up array having a substrate supporting an array of electrostatic transfer heads in accordance with an embodiment of the invention.

Referring to FIG. 7, a micro pick up array having a substrate supporting an array of electrostatic transfer heads is shown in accordance with an embodiment of the invention. Micro pick up array 290 may include a base substrate 702, formed from one or more of silicon, ceramics, and polymers, supporting an array of electrostatic transfer heads 703. Each electrostatic transfer head 703 may include a mesa structure 704 including a top surface 708, which may support an electrode 712. However, electrode 712 is illustrative, and in another embodiment, mesa structure 704 may be wholly or partially conductive, such that electrode 712 may be unnecessary. A dielectric layer 716 covers top surface 708 of each mesa structure 704 and electrode 712, if present. A top contact surface 718 of each electrostatic transfer head 703 has a maximum dimension, for example a length or width of 1 to 100 μm, which may correspond to the size of a micro device to be picked up.

Mesa structure 704 protrudes away from base substrate 702 so as to provide a localized contact point of the top contact surface 718 to pick up a specific micro device during a pick up operation. In an embodiment, mesa structure 704 has a height of approximately 1 μm to 5 μm, or more specifically approximately 2 μm. In an embodiment, mesa structure 704 may have top surface 708 with surface area between 1 to 10,000 square micrometers. Mesa structure 704 may be formed in a variety of geometries, e.g., square, rectangular, circular, oval, etc., while maintaining this general surface area range. The height, width, and planarity of the array of mesa structures on base substrate 702 are chosen so that each electrostatic transfer head 703 can make contact with a corresponding micro device during a pick up operation, and so that an electrostatic transfer head 703 does not inadvertently make contact with a micro device adjacent to an intended corresponding micro device during the pick up operation.

Still referring to FIG. 7, electrode lead 714 may place electrode 712 or mesa structure 704 in electrical connection with a terminal of operating voltage via 720 and with substrate operating voltage contact 722. Thus, an operating voltage may be transferred from substrate operating voltage contact 722 of micro pick up array 290 to an array of electrostatic transfer heads 703 through operating voltage via 720. Operating voltage via 720 may be formed in numerous manners. For example, operating voltage via 720 may be formed by drilling or etching a hole through base substrate 702, passivating the hole with an insulator, and forming a conductive material (e.g., metal) into the passivated hole to form operating voltage via 720 using a suitable technique such as sputtering, e-beam evaporation, electroplating, or electroless deposition.

Micro pick up array 290 may include one or more substrate clamp contacts 724 formed on a back side of micro pick up array 290. In one embodiment, substrate clamp contact 724 includes a conductive pad, such as a metal or semiconductor film. The conductive pad may be electrically isolated from the other active regions of the micro pick up array 290. For example, insulating layers may be formed under, over, and around the conductive pads. In another embodiment, substrate clamp contact 724 may be integrally formed with micro pick up array 290, for example by forming micro pick up array 290 and substrate clamp contact 724 from bulk silicon, and electrically isolating substrate clamp contact 724 from the other active regions of micro pick up array 290.

Figure 8:
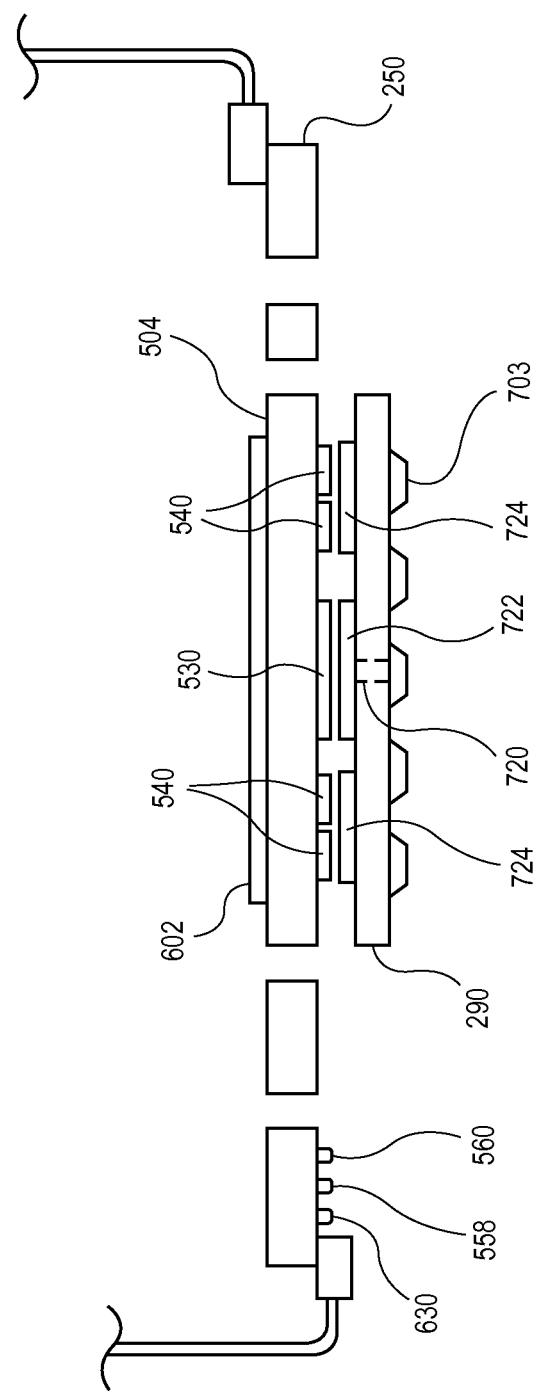
FIG. 8 is a side view illustration of a micro pick up array mount joined with a micro pick up array in accordance with an embodiment of the invention.

Referring to FIG. 8, a cross-sectional side view illustration of a micro pick up array mount joined with a micro pick up array is shown in accordance with an embodiment of the invention. Micro pick up array 290 and micro pick up array mount 250 may be physically and operably joined. As described above, in accordance with the principles of electrostatic grippers and using the attraction of opposite charges, substrate clamp contact 724 of micro pick up array 290 may be aligned with, and electrostatically retained by, clamp electrode 540 on micro pick up array mount 250. More specifically, upon applying an electrostatic voltage to clamp electrode 540 through clamp electrode trace 560, an electrostatic gripping pressure will be applied to substrate clamp electrode 540, causing micro pick up array 290 to physically join with micro pick up array mount 250. Furthermore, one or more substrate operating voltage contacts 722 of micro pick up array 290 may be aligned with, and placed adjacent to, pivot platform operating voltage contacts 530. Thus, a voltage applied to pivot platform operating voltage contact 530 through operating voltage trace 558 may be transferred through substrate operating voltage contact 722 and operating voltage via 720 to one or more electrostatic transfer heads 703. Thus, micro pick up array mount 250 and micro pick up array 290 may be electrically connected to enable micro pick up array 290 to generate an electrostatic gripping force on an array of micro devices.

Heat may be delivered from micro pick up array mount 250 to micro pick up array 290 and/or to an array of micro devices gripped by micro pick up array 290 when those components are physically joined. More specifically, heating element 602 on micro pick up array mount 250 may be resistively heated by delivering electrical current through heating trace 640. Thus, heat may be transferred from heating element 602 through pivot platform 504 to micro pick up array 290. Furthermore, the heat delivered to micro pick up array 290 may dissipate through the array of electrostatic transfer heads 703 into an array of micro devices gripped by the array of electrostatic transfer heads 703.

The embodiments described above with regard to FIGS. 5A-8 thus far have characterized a configuration of micro pick up array mount 250 that may be reversibly paired with micro pick up array 290. However, such a configuration is intended to be illustrative and not exhaustive. For example, an alternative embodiment of micro pick up array mount 250 may include different modes of electrical connection with components of mass transfer tool 100 or mass transfer tool manipulator assembly 102. Furthermore, electrostatic transfer head 703 and/or micro pick up array 290 may be alternatively joined with micro pick up array mount 250 in different manners. Additionally, the design of a compliant element in micro pick up array mount 250 may be changed within the scope of the invention. The following FIGS. 9-12 illustrate several alternative embodiments in accordance with such variations.

Figure 9:
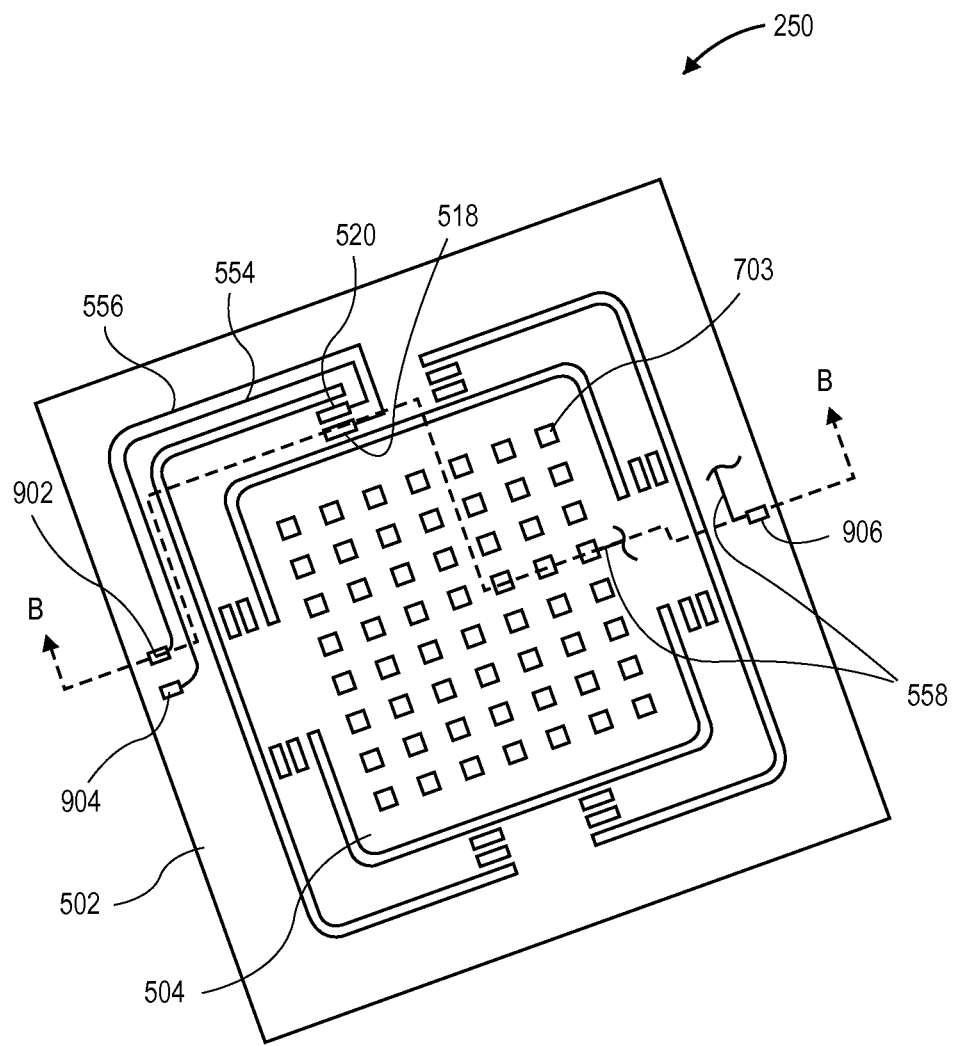
FIG. 9 is a perspective view of a micro pick up array mount having a displacement sensor integrated with a compliant element and an array of electrostatic transfer heads on a pivot platform in accordance with an embodiment of the invention.

Referring to FIG. 9, a perspective view of a micro pick up array mount having a displacement sensor integrated with a compliant element, and an array of electrostatic transfer heads on a pivot platform is shown in accordance with an embodiment of the invention. Most components of the embodiment of micro pick up array mount 250 shown in FIG. 9 are the same or similar to those shown in FIG. 5A. However at least two substantial differences are described below. First, electrical connections between the components on the front face of micro pick up array mount 250 are achieved differently. Second, rather than utilize a separate micro pick up array 290, the array of electrostatic transfer heads 703 are directly integrated with micro pick up array mount 250.

In an embodiment, component traces may terminate at voltage landing pads on base 502 to make electrical connections. For example, displacement sensor trace 554 may interconnect displacement sensor 518 with displacement sensor landing pad 902. Similarly, reference strain gauge trace 556 may interconnect reference strain gauge 520 with reference strain gauge landing pad 904. Furthermore, operating voltage trace 558 may interconnect electrostatic transfer head 703 formed on pivot platform 504 with base operating voltage landing pad 906. The landing pads may be located on via structures that pass through base 502 from a front side to a back side of micro pick up array mount 250. Landing pads may be formed using processes similar to those used to form traces, e.g., using sputtering processes.

In an embodiment, an array of electrostatic transfer heads are supported directly by pivot platform 504. The structure and formation of the array of electrostatic transfer heads 703 may be the same or similar to that described above with respect to FIG. 7. For example, each electrostatic transfer head 703 may include mesa structure 704 with top surface 708 covered by dielectric layer 716 and optionally supporting electrode 712. However, the array of electrostatic transfer heads are located on a surface of pivot platform 504 instead of micro pick up array 290 surface. Furthermore, operating voltage traces 458 may replace electrode leads 714.

Figure 10:
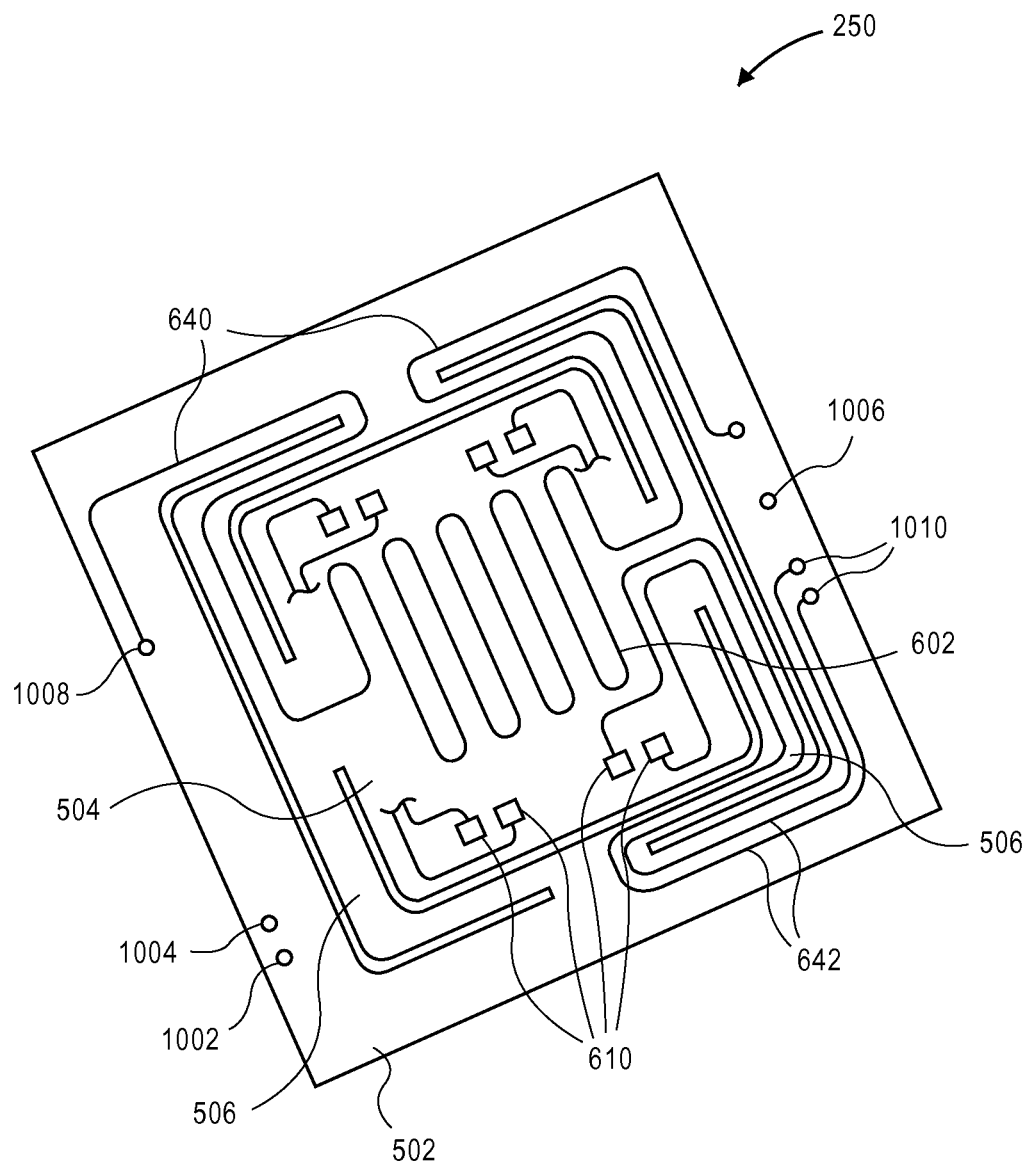
FIG. 10 is a perspective view of a micro pick up array mount having a heating element on a pivot platform in accordance with an embodiment of the invention.

Referring to FIG. 10, a perspective view of a micro pick up array mount having a heating element on a pivot platform is shown in accordance with an embodiment of the invention. In an embodiment, one or more contacts may be located on base 502 and placed in electrical connection with components of micro pick up array mount 250. Some of the base 502 contacts may be placed in electrical connection with components on the front side of micro pick up array mount 250. For example, displacement sensor contact 1002 may be located at a terminal of displacement sensor via (FIG. 11) in electrical connection with displacement sensor landing pad 902. Similarly, reference strain gauge contact 1004 may be located at a terminal of a via (not shown) in electrical connection with reference strain gauge landing pad 904. Furthermore, base operating voltage contact 1006 may be located at a terminal of base operating voltage via (FIG. 11) in electrical connection with base operating voltage landing pad 906. Others of the base 502 contacts may be placed in electrical connection with components on the back side of micro pick up array mount 250. For example, heating contact 1008 may be placed in electrical connection with heating element 602 through heating trace 640. Similarly, temperatures sensor contact 1010 may be placed in electrical connection with temperature sensor 610 through temperature sensor trace 642.

Figure 11:
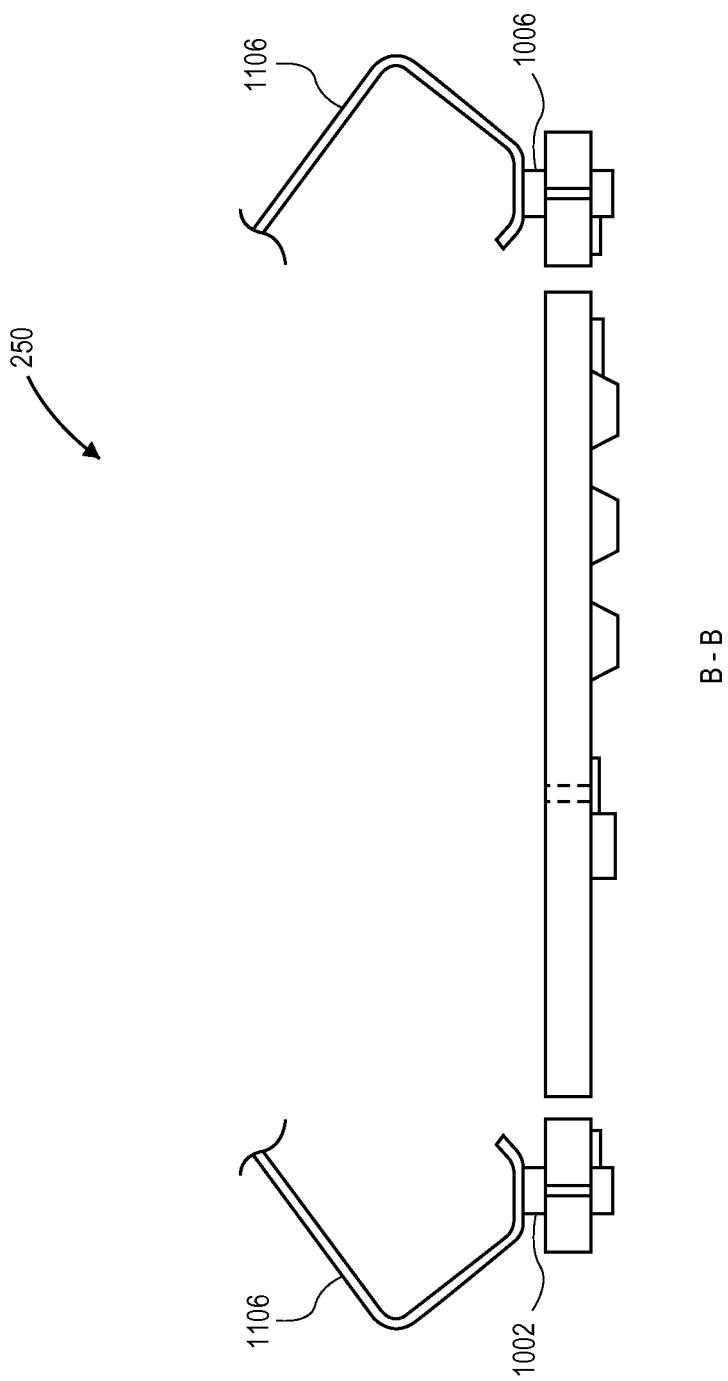
FIG. 11 is a cross-sectional side view illustration of a micro pick up array mount in electrical connection with a spring contact, taken about section line B-B of FIG. 9, in accordance with an embodiment of the invention.

Referring to FIG. 11, a cross-sectional side view illustration of a micro pick up array mount in electrical connection with a spring contact, taken about section line B-B of FIG. 9, is shown in accordance with an embodiment of the invention. One or more of the contacts, e.g., displacement sensor contact 1002 or base operating voltage contact 1006, may be pressed against spring contact 1106. Spring contact 1106 may further be connected with components of mass transfer tool 100 or mass transfer tool manipulating assembly 102 through electrical connections such as wiring leads and/or contact boards (not shown). Thus, numerous manners are available to electrically connect components on micro pick up array mount 250 and components of mass transfer tool 100 or mass transfer tool manipulator assembly 102.

Figure 12:
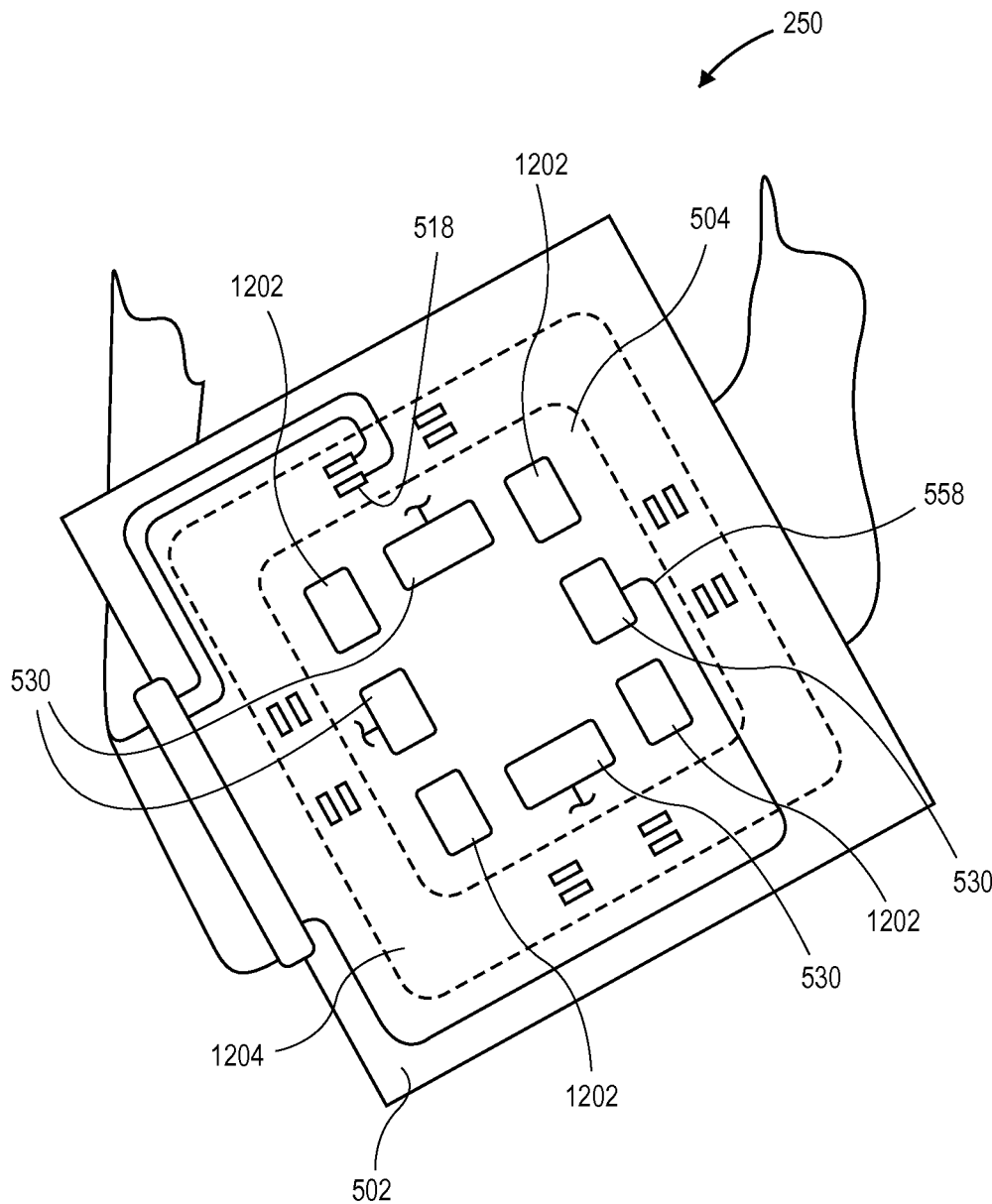
FIG. 12 is a perspective view illustration of a micro pick up array mount having a flexible region in accordance with an embodiment of the invention.

Referring to FIG. 12, a perspective view illustration of a micro pick up array mount having a flexible region is shown in accordance with an embodiment of the invention. Most components of the embodiment of micro pick up array mount 250 shown in FIG. 12 are the same or similar to those shown in FIG. 5A. However at least two differences are described below. First, in an embodiment, micro pick up array mount 250 illustrated in FIG. 12 may be permanently joined with micro pick up array 290. Second, in an embodiment, micro pick up array mount 250 illustrated in FIG. 12 includes a compliant element without a beam 506.

In an embodiment, micro pick up array mount 250 and micro pick up array 290 may be joined using one or more bonding pads 1202 to replace clamp electrode 540. Bonding pad 1202 may be formed of a variety of materials including polymers, solders, metals, and other adhesives to facilitate the formation of a permanent bond with another structure. In an embodiment, bonding pads 1202 may include gold, copper, or aluminum to facilitate thermocompression bonding with an adjacent structure. However, thermocompression bonding represents only one manner of forming a permanent bond between structures, and bonding pad 1202 may include other materials that facilitate the formation of a bond between the micro pick up array mount 250 and another part or structure with other bonding mechanisms. For example, direct bonding, adhesive bonding, reactive bonding, soldering, etc., may be used at numerous bonding sites having various shapes and sizes.

To facilitate permanent bonding between micro pick up array 290 and micro pick up array mount 250, substrate clamp contact 724 on micro pick up array 290 may be formed of a metallic material that facilitates a thermocompression bond with bonding pad 1202, for example, both bonding pad 1202 and substrate clamp contact 724 may be formed from gold. Prior to permanently bonding micro pick up array mount 250 and micro pick up array 290, pivot platform operating voltage contact 530 and substrate operating voltage contact 722 may be aligned to allow the components to be operably joined. After aligning the components, a permanent thermocompression bond may be formed to permanently join micro pick up array mount 250 with micro pick up array 290.

In an embodiment, the compliant element of micro pick up array mount 250 includes a singular surface not having beam 506. More specifically, a compliant element may be located between pivot platform 504 and base 502, without being separated by channels 522. For example, a compliant element may include flexible region 1204 delineated by a dotted line, which exists between pivot platform 504 and base 502. Flexible region 1204 may be integrally formed with pivot platform 504 and base 502, but may have different stiffness from those components. Alternatively, the difference in stiffness may be due to varied structural characteristics, such as through forming flexible region 1204 with a thinner cross-section or a flexible form, e.g., as in the case of a bellows. The reduced stiffness of flexible region 1204 may permit flexible region 1204 to flex and allow relative movement between pivot platform 504 and base 502. Thus, one or more displacement sensor 518 may be integrated with flexible region 1204 to sense deformation of flexible region 1204. In an embodiment, electrical leads may be directly routed across flexible region 1204 of micro pick up array mount 250. For example, operating voltage trace 558 may cross directly through flexible region 1204, as opposed to being routed around channels 522 as shown in the embodiment of FIG. 5A.

Figure 13:
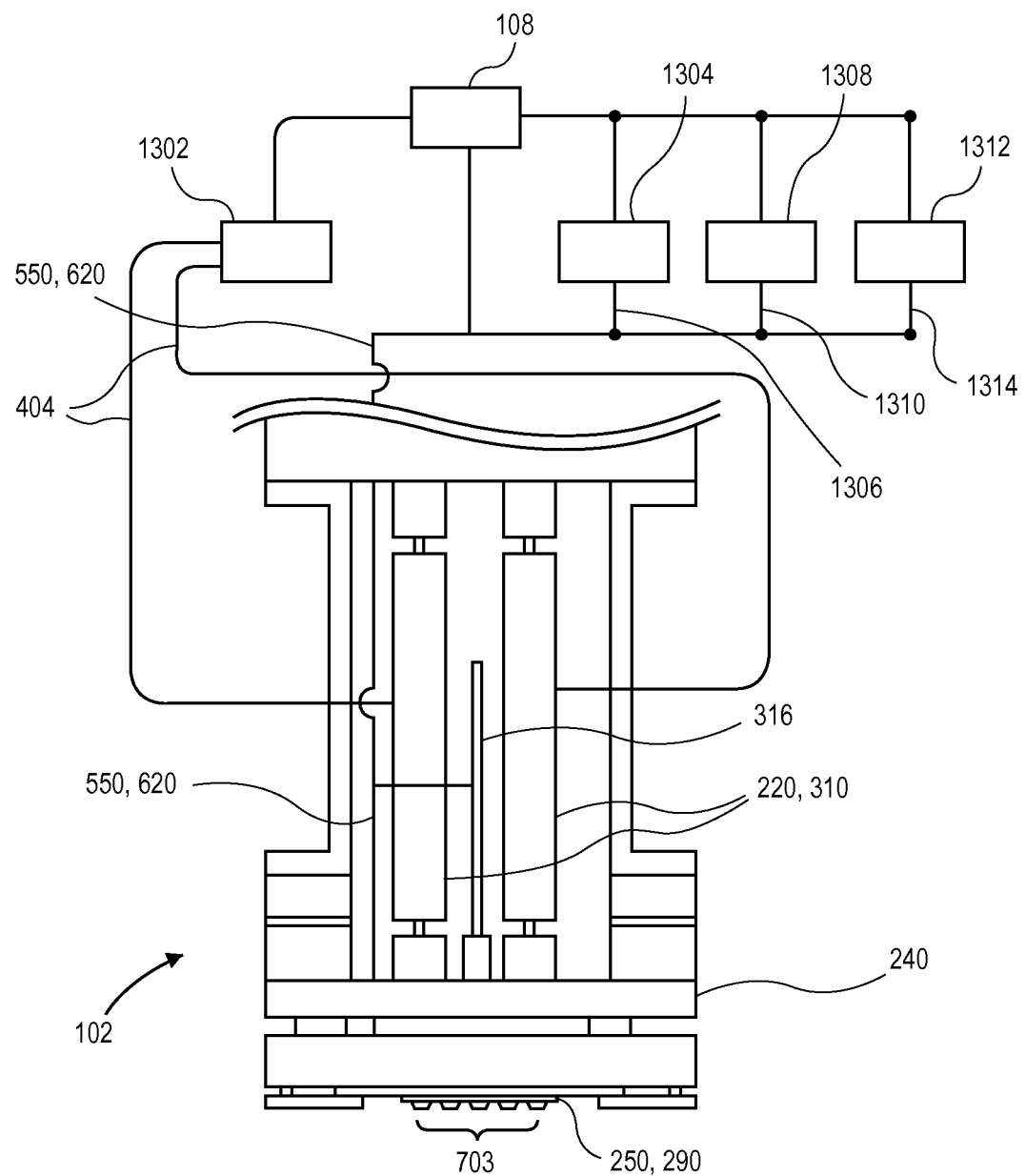
FIG. 13 is a side view illustration of a mass transfer tool manipulator assembly holding a micro pick up array and interconnected with a control system in accordance with an embodiment of the invention.

Having described several of the individual components of mass transfer tool manipulator assembly 102, attention shall now be turned to the overall function and control of the mass transfer tool manipulator assembly 102. Referring to FIG. 13, a side view illustration of a mass transfer tool manipulator assembly holding a micro pick up array and interconnected with a control system is shown in accordance with an embodiment of the invention. The illustrated system may be used to perform methods including the transfer of micro devices from carrier substrate to receiving substrate. More specifically, the system may be used to actively control the spatial relationship between an array of electrostatic transfer heads 703 coupled with micro pick up array mount 250 and an array of micro devices on a carrier substrate or a receiving substrate. Furthermore, the system may be used to control an electrostatic gripping force between the array of electrostatic transfer heads 703 and the array of micro devices. In addition, the system may be used to control heat delivered to the array of electrostatic transfer heads 703, e.g., while the array of electrostatic transfer heads 703 contacts the array of micro devices. Furthermore, the system may be used to control retention of an array of electrostatic transfer heads 703 against micro pick up array mount 250.

In an embodiment, actuation of actuator assembly 220, under the control of computer system 108, affects motion of micro pick up array 290. For example, computer system 108 may be connected with an actuator power supply 1302 directly or through intermediate controllers to provide control signals that cause actuator power supply 1302 to regulate movement of one or more actuator 310, e.g., piezoelectric actuators, to move distribution plate 240 coupled with micro pick up array mount 250. Micro pick up array mount 250 may retain micro pick up array 290. Such regulation may be based on signals delivered from actuator power supply 1302 to actuator assembly 220 through actuator lead 404.

In an embodiment, activating an array of electrostatic transfer heads provides for electrostatic gripping of an array of micro devices. For example, computer system 108 may be connected with an operating voltage supply 1304 directly or through intermediate controllers to provide control signals that cause operating voltage supply 1304 to deliver an electrostatic voltage to electrostatic transfer heads through operating voltage lead 1306. Operating voltage lead 1306 may be integrated within, e.g., front flex circuit 550 or back flex circuit 620, to deliver operating voltage as described above.

In an embodiment, heating of an array of electrostatic transfer heads may be controlled by delivering power to heating element 602. For example, computer system 108 may be connected with heating voltage supply 1308 directly or through intermediate controllers to provide control signals that cause heating voltage supply 1308 to deliver power to heating element 602 through heating voltage lead 1310. Heating voltage lead 1310 may be integrated within, e.g., front flex circuit 550 or back flex circuit 620, to deliver heating power as described above.

In an embodiment, micro pick up array 290 having an array of electrostatic transfer heads may be retained against micro pick up array mount 250 by delivering an electrostatic voltage to clamp electrode 540. For example, computer system 108 may be connected with a clamping voltage supply 1312 directly or through intermediate controllers to provide control signals that cause clamping voltage supply 1312 to deliver an electrostatic voltage to clamp electrode 540 through clamping voltage lead 1314. Clamping voltage lead 1314 may be integrated within, e.g., front flex circuit 550 or back flex circuit 620, to deliver clamping voltage as described above.

Control of the motion, electrostatic gripping, and heating functions of mass transfer tool manipulator assembly 102 may be based on feedback delivered from sensors associated with micro pickup array mount. For example, temperature data may be provided from temperature sensor 610 to computer system 108 through, e.g., back flex circuit 620. Similarly, position-related data may be delivered from one or more displacement sensor 518 to computer system 108 through, e.g., front flex circuit 550.

In an embodiment, position-related data from displacement sensor 518 may be input to, and transformed by, position sensing module 316 prior to being delivered to computer system 108. For example, position sensing module 316 or another component may apply an excitation voltage to one or more displacement sensor 518, e.g., strain gauges, and an analog output voltage from displacement sensor 518 may be monitored by position sensing module 316. The analog output voltages from the one or more displacement sensors may then undergo analog-to-digital processing by position sensing module 316, and the resulting digital signals may be input to computer system 108, or further processed through logical operations, to facilitate performance of a control algorithm for controlling motion of mass transfer tool manipulator assembly 102.

Figure 14:
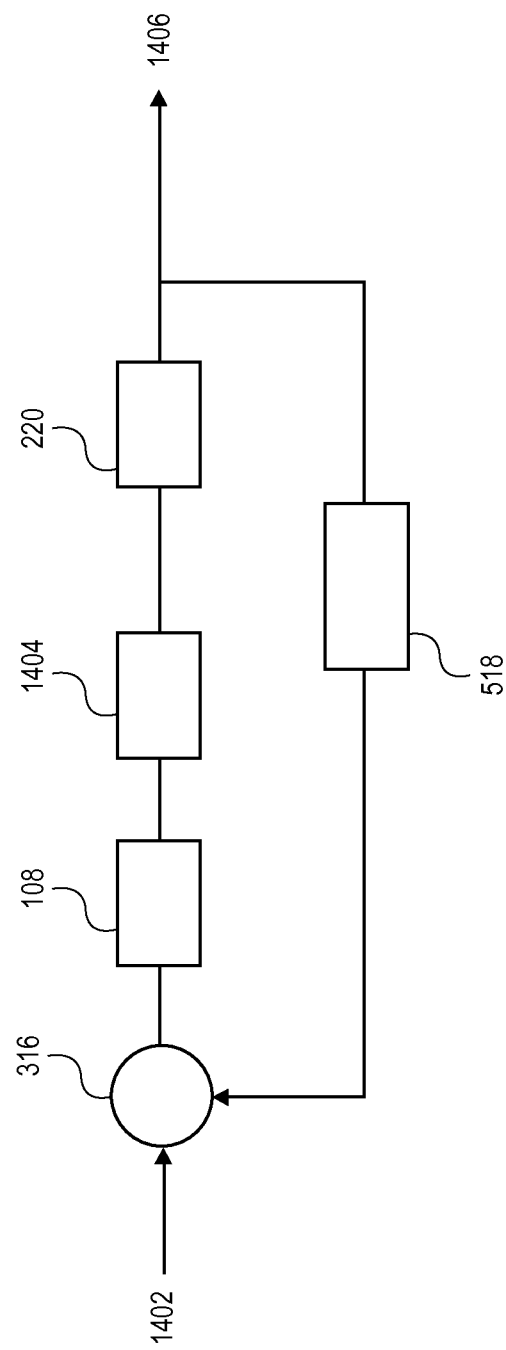
FIG. 14 is a schematic illustration of a control loop to regulate a mass transfer tool manipulator assembly in accordance with an embodiment of the invention.

Referring to FIG. 14, a schematic illustration of a control loop to regulate a mass transfer tool manipulator assembly is shown in accordance with an embodiment of the invention. In an embodiment, the control loop may be closed to achieve the goal of evenly distributing pressure across micro pick up array mount 250. In other words, the control loop may regulate mass transfer tool manipulator assembly 102 to change the center of pressure on micro pick up array mount 250 to a desired location, e.g., to center pressure applied to pivot platform 504 and evenly distribute pressure throughout the compliant element(s) surrounding pivot platform 504. Thus, setpoint 1402 may define a set of reference signals that correspond to each displacement sensor 518 sensing the same deformation in a respective beam 506. Displacement measurements from each displacement sensor 518 may be input to position sensing module 316 as feedback related to a current state of pressure distribution across micro pick up array mount 250. Position sensing module 316 may perform analog-to-digital signal processing and calculate, or deliver processed signals to computer system 108 for calculation of, e.g., an error signal. Based on the error signal, computer system 108 may use a control algorithm to determine appropriate control signals to actuate actuator assembly 220 to achieve even distribution of pressure across micro pick up array mount 250. These control signals may be delivered directly to actuator assembly 220, or they may be modified, e.g., by increasing control signal power, with amplifier 1404. Furthermore, the control signals may be fed directly to actuator assembly 220 or to actuator power supply 1302 for driving actuator assembly 220. Displacement measurements from each displacement sensor 518 may continue to be monitored and fed into a control algorithm to continue to adjust actuator assembly 220 until output 1406 equals setpoint 1402, i.e., until pressure evenly distributes across micro pick up array mount 250. This basic control loop model will be described further below in relation to embodiments of methods for using mass transfer tool manipulator assembly 102 to pick up and place an array of micro devices.

In the following description, reference is made to FIGS. 15-24 when describing manners of operating a mass transfer tool manipulator assembly to transfer an array of micro devices in accordance with embodiments of the invention. It is to be appreciated that the schematic illustrations provided in FIGS. 16-19 and FIGS. 21-24 are simplified two dimensional illustrations. For example, deflection of compliant elements such as schematic beams 1606, 1608 and actuation of the mass transfer tool manipulator assembly 102 with a pair of schematic actuators 1602, 1604 is illustrated and described in two dimensions. It is to be appreciated however, that deflection and actuation of the mass transfer tool manipulator assembly 102 in accordance with embodiments of the invention is not so limited. For example, as described above, various actuators may be used to provide additional degrees of freedom, and these degrees of freedom may not be fully represented by the two-dimensional depiction of FIGS. 16-19 and FIGS. 21-24. More particularly, as shown in FIG. 4A, the actuator assembly 220 may include more than two actuators, e.g., three actuators 310. In such a case, pivot platform 504 may be tilted or tipped in a third dimension about an axis running across the page surface, which is not represented by FIGS. 16-19 and FIGS. 21-24.

Figure 15:
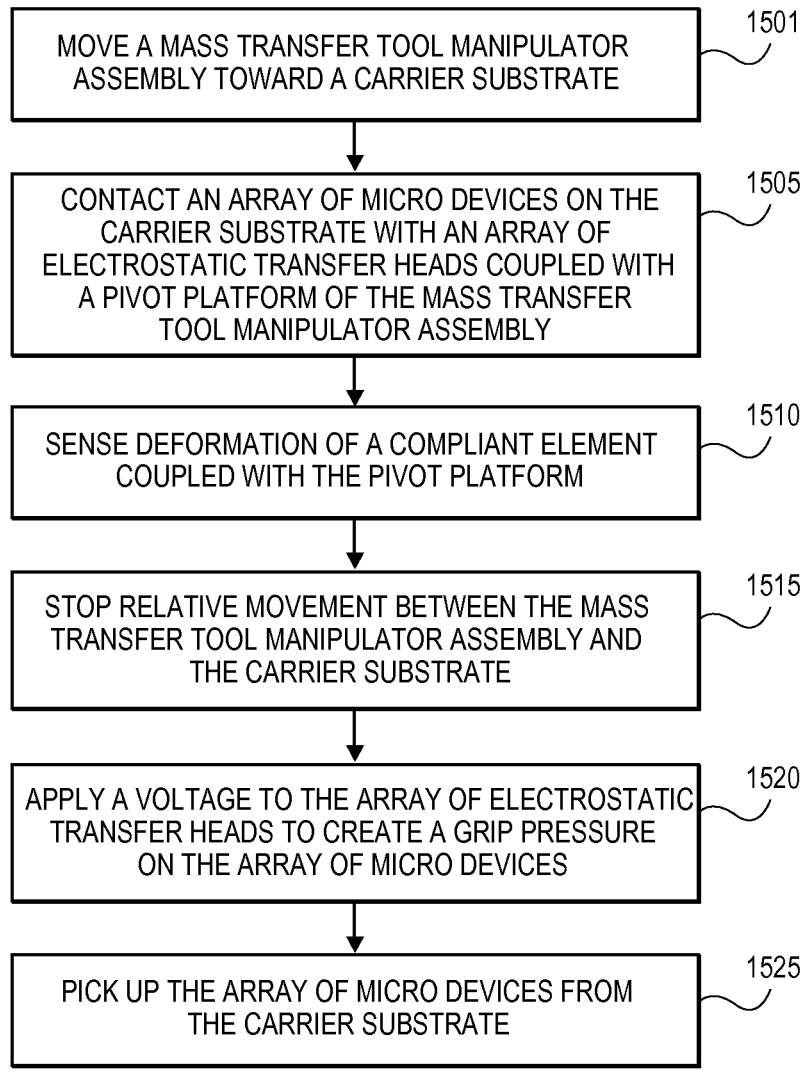
FIG. 15 is a flowchart illustrating a method of picking up an array of micro devices from a carrier substrate in accordance with an embodiment of the invention.
Figure 16:
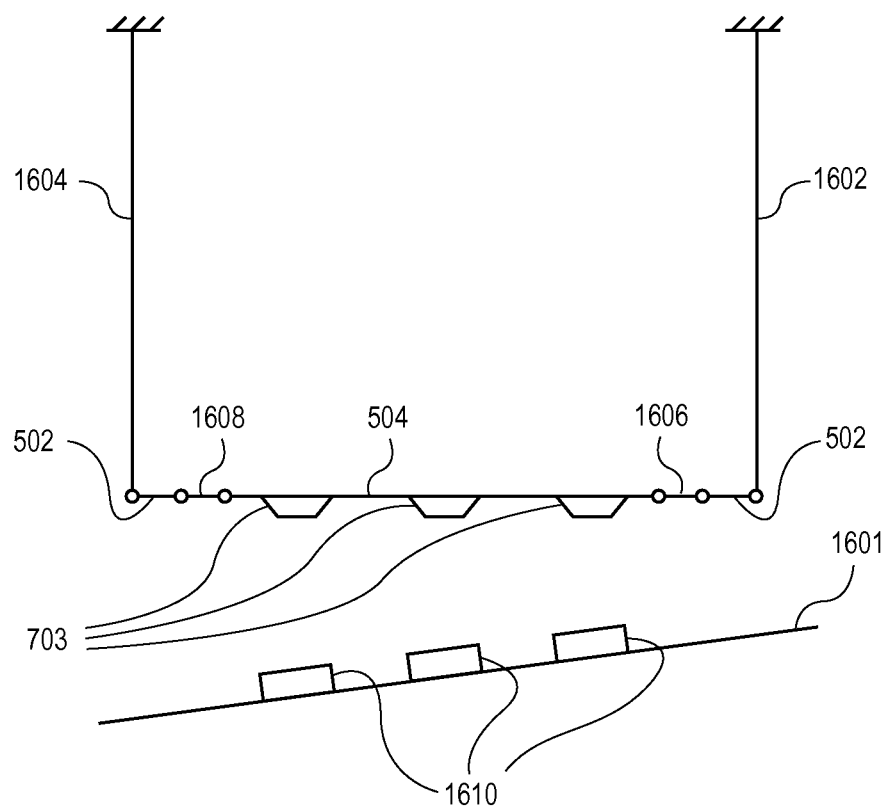
FIG. 16 is a schematic illustration of a mass transfer tool manipulator assembly moving toward a carrier substrate in accordance with an embodiment of the invention.

Referring to FIG. 15, a flowchart illustrating a method of picking up a micro device from a carrier substrate is shown in accordance with an embodiment of the invention. For illustrational purposes, the following description of FIG. 15 makes reference to the embodiments illustrated in FIGS. 16-19. At operation 1501, mass transfer tool manipulator assembly 102 moves toward carrier substrate. Referring to FIG. 16, a schematic illustration of a mass transfer tool manipulator assembly moving toward a carrier substrate 1601 is shown in accordance with an embodiment of the invention. Movement of manipulator assembly, and more specifically pivot platform 504, may be achieved by actuation of various actuators of mass transfer tool 100 or by actuating both first schematic actuator 1602 and second schematic actuator 1604 to extend in length. Electrostatic transfer heads 703 are schematically represented as being mounted on pivot platform 504, although electrostatic transfer heads 703 may instead be mounted on micro pick up array 290 retained against pivot platform 504. As shown, pivot platform 504 may be undeflected relative to base 502, and thus, both first schematic beam 1606 and second schematic beam 1608 may be undisplaced or undeformed. In this initial state, there may be a gap between array of electrostatic transfer heads 703 and array of micro devices 1610 on carrier substrate 1601, e.g., this snapshot may be prior to contacting array of micro devices 1610 with array of electrostatic transfer heads 703. Here, the illustrated exaggeration of the gap indicates that pivot platform 504 and carrier substrate 1601 may be misaligned with each other.

Figure 17:
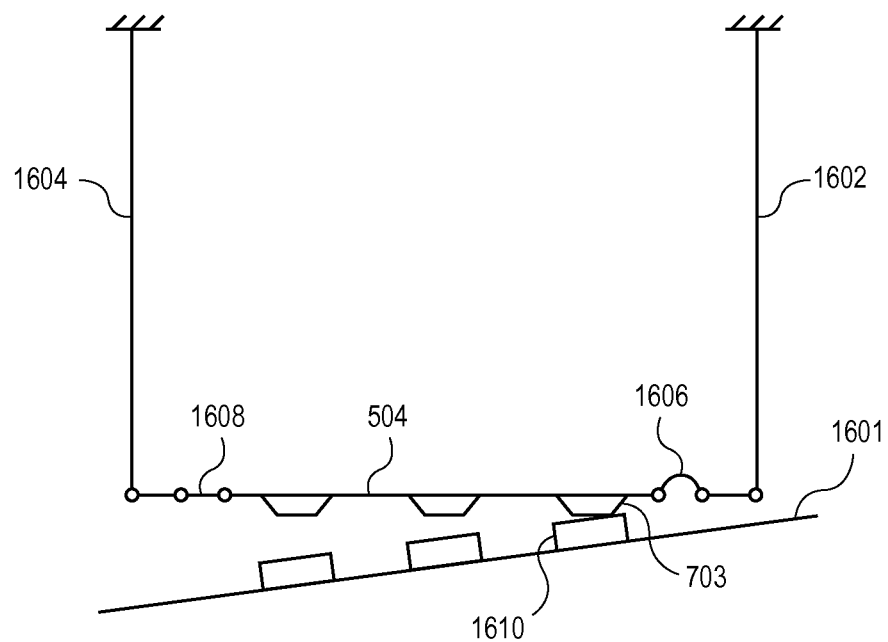
FIG. 17 is a schematic illustration of an array of electrostatic transfer heads coupled with a mass transfer tool manipulator assembly contacting an array of micro devices on a carrier substrate in accordance with an embodiment of the invention.

Referring again to FIG. 15, at operation 1505 array of micro devices 1610 on carrier substrate 1601 may be contacted with array of electrostatic transfer heads 703 coupled with pivot platform 504 of mass transfer tool manipulator assembly 102. Referring to FIG. 17, a schematic illustration of an electrostatic transfer head coupled with a mass transfer tool manipulator assembly contacting a micro device on a carrier substrate is shown in accordance with an embodiment of the invention. In an embodiment, as pivot platform 504 approaches carrier substrate 1601 out of alignment, an electrostatic transfer head 703 nearest first schematic beam 1606 may contact a micro device 1610 before contacting a micro device 1610 with an electrostatic transfer head 703 nearest second schematic beam 1608. Thus, first schematic beam 1606 may deform, while second schematic beam 1608 may not.

Referring again to FIG. 15, at operation 1510 deformation of a compliant element coupled with pivot platform 504 may be sensed. Referring again to FIG. 17, in an embodiment, as first schematic beam 1606 deforms, displacement sensor 518 (see FIG. 5A) generates a displacement signal associated with first schematic beam 1606. The displacement signal may be monitored and/or measured, e.g., by position sensing module 316. For example, the displacement signal may be fed back to position sensing module 316 to determine that deformation of first schematic beam 1606 has occurred, and to calculate an error signal indicating the presence of an uneven pressure distribution across pivot platform 504.

Figure 18:
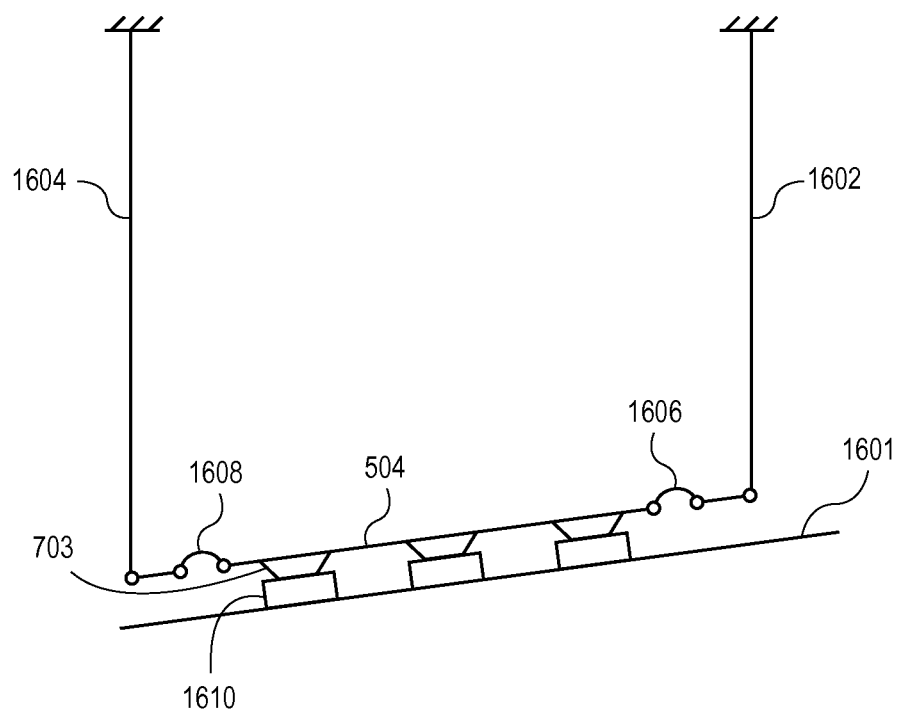
FIG. 18 is a schematic illustration of a mass transfer tool manipulator assembly adjusting a position of a micro pick up array mount in accordance with an embodiment of the invention.

Referring to FIG. 18, a schematic illustration of a mass transfer tool manipulator assembly adjusting a position of a micro pick up array mount is shown in accordance with an embodiment of the invention. After sensing deformation in first schematic beam 1606 and calculating an error signal from the measured data, a control signal may be delivered from computer system 108 to actuator assembly 220, causing second schematic actuator 1604 to extend while maintaining first schematic actuator 1602 length. More specifically, second schematic actuator 1604 may be extended to adjust the spatial orientation of pivot platform 504 until the nearby electrostatic transfer head 703 contacts a micro device 1610, e.g., once pivot platform 504 aligns with carrier substrate 1601. Furthermore, adjustment may be based on continued feedback signals from displacement sensors associated with first schematic beam 1606 and second schematic beam 1608. That is, adjustment may continue until the measured deformation in first schematic beam 1606 and second schematic beam 1608 is approximately equal. At this point, the pressure distribution across pivot platform 504 in the illustrated plane may be even.

Referring again to FIG. 15, at operation 1515 relative movement between the mass transfer tool manipulator assembly 102 and carrier substrate 1601 stops. Referring again to FIG. 17, once pressure is evenly distributed across pivot platform 504, actuation of actuator assembly 220 according to control signals may be ceased. At this point, output 1406 of the control loop may equal setpoint 1402. That is, the error signal may be zero or within a predefined range, indicating that the deformation sensed by each displacement sensor 518 is approximately equal. This deformation value may be further defined through the control loop to achieve a desired pressure between array of electrostatic transfer heads 703 and array of micro devices 1610. For example, sufficient pressure may be applied to ensure secure contact while avoiding damage to electrostatic transfer heads 703 and micro devices 1610 from excessive pressure application.

Referring again to FIG. 15, at operation 1520 a voltage may be applied to array of electrostatic transfer heads to create a grip pressure on array of micro devices. As shown in FIG. 18, with array of electrostatic transfer heads 703 placed in contact with array of micro devices 1610, an electrostatic voltage may be applied to electrostatic transfer heads 703 through various contacts and connectors, e.g., operating voltage lead 1306, operating voltage trace 558, operating voltage via 720, etc., of the mass transfer tool manipulator assembly 102, micro pick up array mount 250, and micro pick up array 290. More specifically, voltage may be transmitted from operating voltage supply 1304 to array of electrostatic transfer heads 703 based on control signals from computer system 108. For example, the control signals may be based on a control algorithm instructing that electrostatic transfer heads be activated if a predefined deformation is simultaneously sensed by each displacement sensor 518 during a pick up process. As a result, array of electrostatic transfer heads applies a gripping pressure to array of micro devices 1610.

Figure 19:
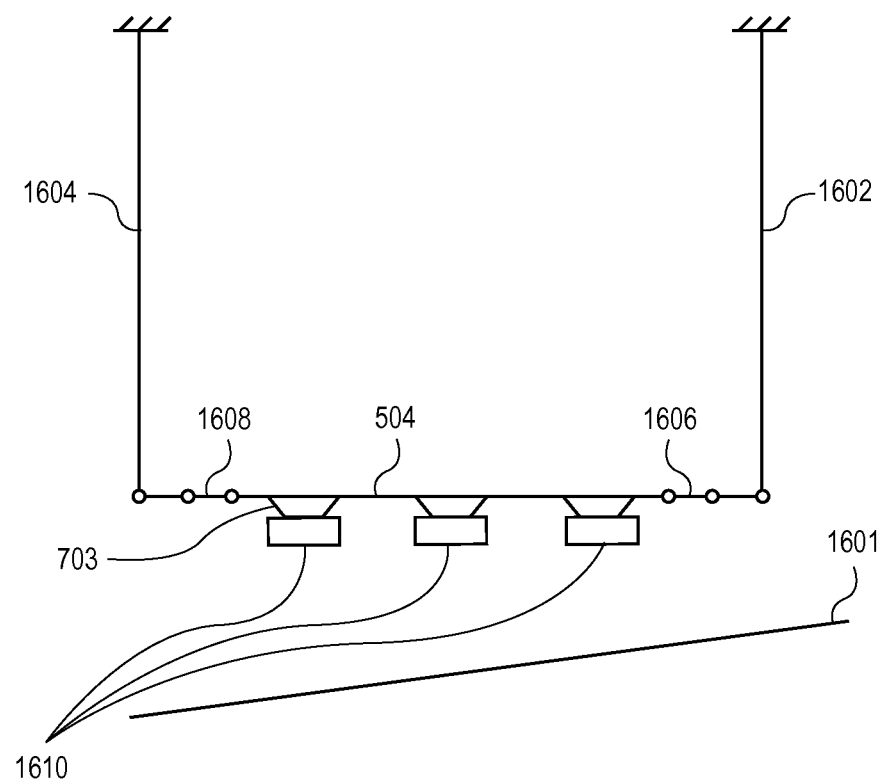
FIG. 19 is a schematic illustration of a mass transfer tool manipulator assembly picking up an array of micro devices from a carrier substrate in accordance with an embodiment of the invention.

Referring again to FIG. 15, at operation 1525 array of micro device 1610 may be picked up from carrier substrate 1601. Referring to FIG. 19, a schematic illustration of a mass transfer tool manipulator assembly picking up a micro device from a carrier substrate is shown in accordance with an embodiment of the invention. First schematic actuator 1602 and second schematic actuator 1604 may be controlled by computer system 108 to retract pivot platform 504 from carrier substrate 1601. During retraction, first schematic beam 1606 and second schematic beam 1608 may return toward an undeformed state, as the beams release stored energy and spring back to an initial configuration. Simultaneously, displacement sensors associated with the beams may transmit signals to position sensing module 316 that indicate the beams are not deformed. However, at this stage a control algorithm may instruct that pivot platform 504 be retracted further to clear the array of micro devices 1610 for transfer to a receiving substrate. This retraction may be achieved through actuation of actuator assembly 220, or in another embodiment, through actuation of various actuators of mass transfer tool 100. Furthermore, in an embodiment, retraction may be achieved by deactivating actuator assembly 220 and allowing the inherent stiffness of flexible coupling 414 of tip-tilt-z flexure 230 to restore tip-tilt-z flexure 230 to an initial state, which causes retraction of micro pick up array mount 250. During pick up, the electrostatic voltage supplied to the array of electrostatic transfer heads may persist, and thus, array of micro devices 1610 may be retained on the electrostatic transfer heads 703 and removed from carrier substrate 1601.

During the pick up operation described with respect to FIG. 15, heating element 602 on micro pick up array mount 250 may be heated. For example, heating element 602 may be resistively heated to transfer heat to micro pick up array 290 and to micro devices in contact with electrostatic transfer heads. Heat transfer may occur before, during, and after picking up the array of micro devices 1610 from carrier substrate 1601.

Figure 20:
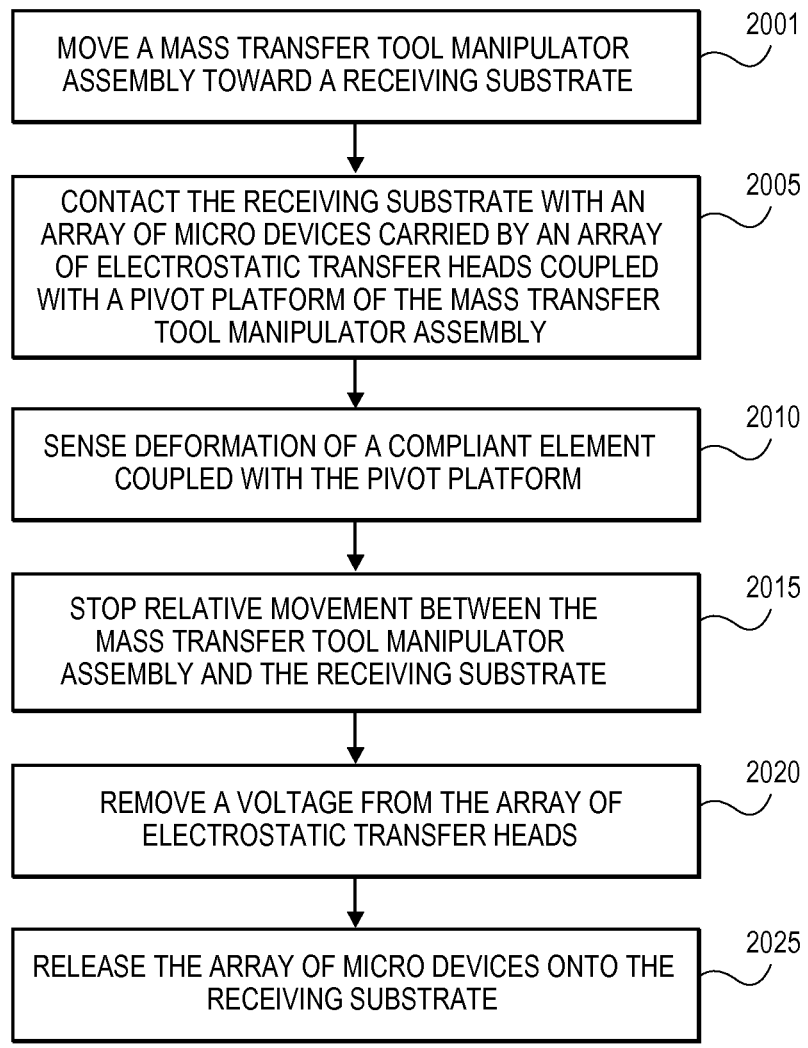
FIG. 20 is a flowchart illustrating a method of placing an array of micro devices on a receiving substrate in accordance with an embodiment of the invention.
Figure 21:
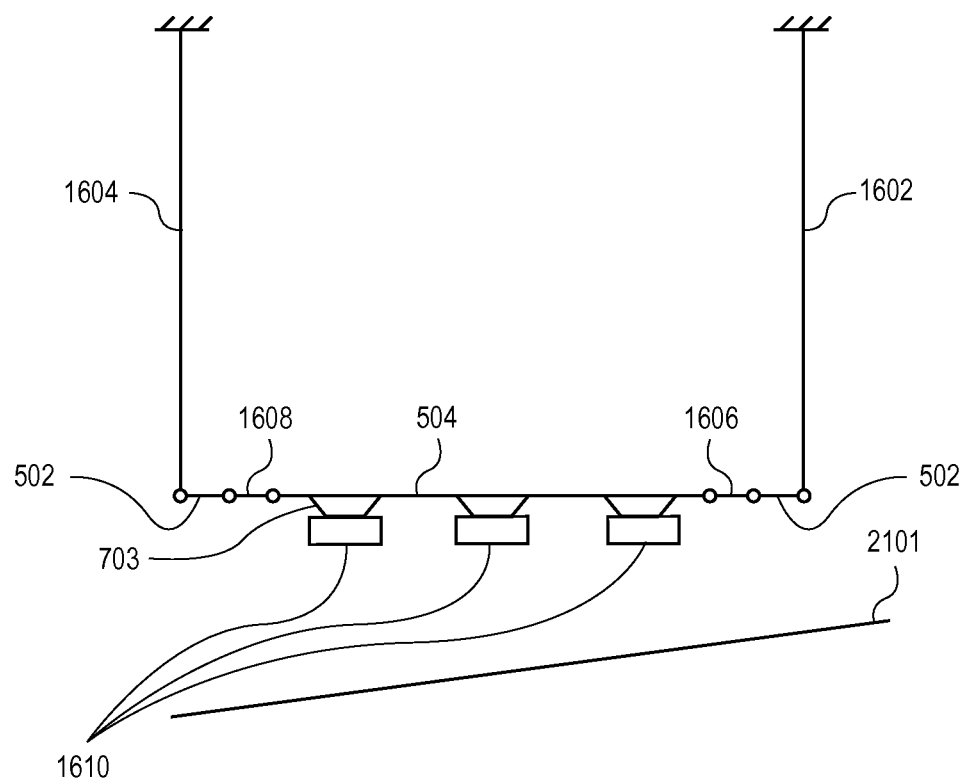
FIG. 21 is a schematic illustration of a mass transfer tool manipulator assembly moving toward a receiving substrate in accordance with an embodiment of the invention.

Referring to FIG. 20, a flowchart illustrating a method of placing a micro device on a receiving substrate is shown in accordance with an embodiment of the invention. For illustrational purposes, the following description of FIG. 20 makes reference to the embodiments illustrated in FIGS. 21-24. At operation 2001, mass transfer tool manipulator assembly 102 moves toward a receiving substrate. Referring to FIG. 21, a schematic illustration of a mass transfer tool manipulator assembly moving toward a receiving substrate is shown in accordance with an embodiment of the invention. Movement of manipulator assembly, and more specifically pivot platform 504, may be achieved by actuation of various actuators of mass transfer tool 100 or by actuating both first schematic actuator 1602 and second schematic actuator 1604 to extend in length. As shown, pivot platform 504 may be undeflected relative to base 502, and thus, both first schematic beam 1606 and second schematic beam 1608 may be undisplaced or undeformed. In this initial state, there may be a gap between array of micro devices 1610 gripped by array of electrostatic transfer heads 703 and receiving substrate 2101, e.g., this snapshot may be prior to contacting receiving substrate 2101 with array of micro devices 1610. Here, the illustrated exaggeration in the gap indicates that pivot platform 504 and receiving substrate 2101 may be misaligned with each other.

Figure 22:
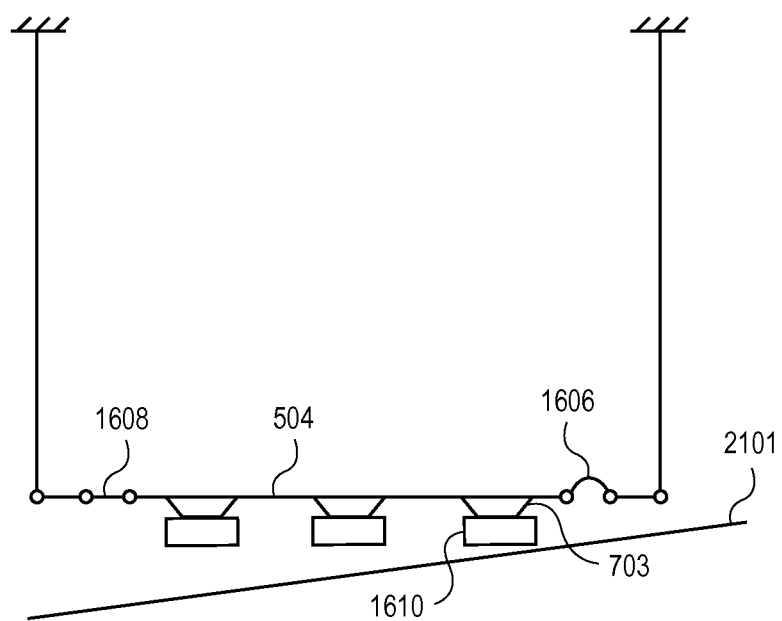
FIG. 22 is a schematic illustration of an array of micro devices carried by an array of electrostatic transfer heads coupled with a mass transfer tool manipulator assembly contacting a receiving substrate in accordance with an embodiment of the invention.

Referring again to FIG. 20, at operation 2005 receiving substrate 2101 is contacted with array of micro devices carried by array of electrostatic transfer heads coupled with pivot platform of mass transfer tool manipulator assembly. Referring to FIG. 22, a schematic illustration of a micro device carried by an electrostatic transfer head coupled with a mass transfer tool manipulator assembly contacting a receiving substrate is shown in accordance with an embodiment of the invention. In an embodiment, as pivot platform 504 approaches receiving substrate 2101 out of alignment, a micro device 1610 gripped by an electrostatic transfer head 703 nearest first schematic beam 1606 may contact receiving substrate 2101 before receiving substrate 2101 contacts a micro device gripped by an electrostatic transfer head nearest second schematic beam 1608. Thus, first schematic beam 1606 may deform, while second schematic beam 1608 may not.

Referring again to FIG. 20, at operation 2010 deformation of a compliant element coupled with pivot platform 504 may be sensed. Referring again to FIG. 22, in an embodiment, as first schematic beam 1606 deforms, displacement sensor 518 associated with first schematic beam 1606 generates a displacement signal. The displacement signal may be monitored and/or measured, e.g., by position sensing module 316. For example, the displacement signal may be fed back to position sensing module 316 to determine that deformation of first schematic beam 1606 has occurred, and to calculate an error signal indicating the presence of an uneven pressure distribution across pivot platform 504.

Figure 23:
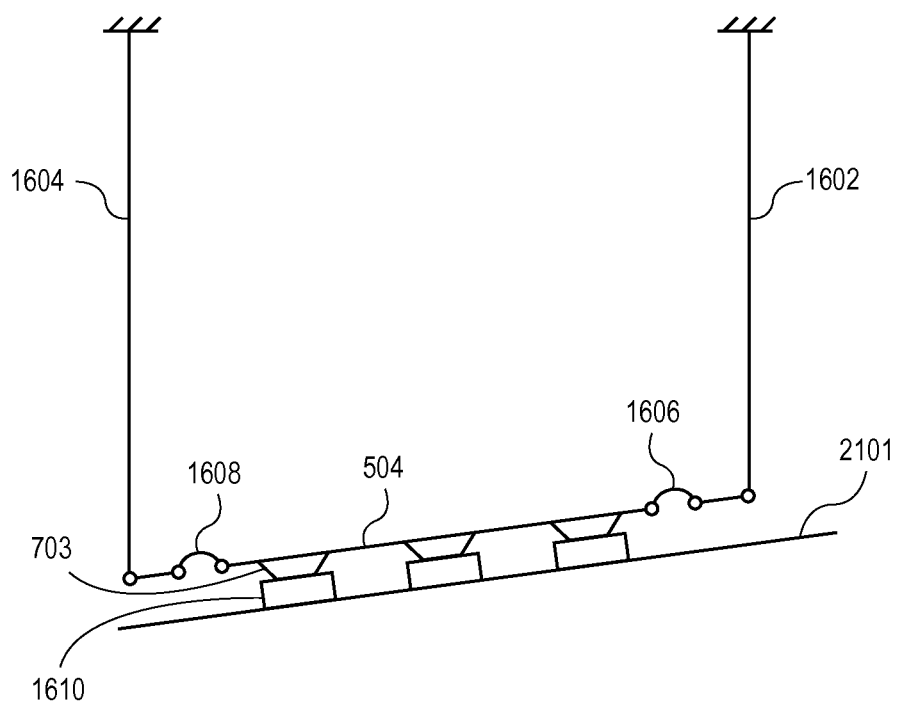
FIG. 23 is a schematic illustration of a mass transfer tool manipulator assembly adjusting a position of a micro pick up array mount in accordance with an embodiment of the invention.

Referring to FIG. 23, a schematic illustration of a mass transfer tool manipulator assembly adjusting a position of a micro pick up array mount is shown in accordance with an embodiment of the invention. After sensing deformation in first schematic beam 1606 and calculating an error signal from the measured data, a control signal may be delivered from computer system 108 to actuator assembly 220, causing second schematic actuator 1604 to extend while maintaining first schematic actuator 1602 length. More specifically, second schematic actuator 1604 may be extended to adjust the spatial orientation of pivot platform 504 until the nearby electrostatic transfer head 703 contacts a micro device 1610, e.g., once pivot platform 504 aligns with receiving substrate 2101. Furthermore, adjustment may be based on continued feedback signals from displacement sensors associated with first schematic beam 1606 and second schematic beam 1608. That is, adjustment may continue until the measured deformation in first schematic beam 1606 and second schematic beam 1608 is approximately equal. At this point, the pressure distribution across pivot platform 504 in the illustrated plane may be even.

Referring again to FIG. 20, at operation 2015 relative movement between mass transfer tool manipulator assembly 102 and receiving substrate 2101 may be stopped. Referring again to FIG. 23, once pressure is evenly distributed across pivot platform 504, actuation of actuator assembly 220 according to control signals may be ceased. At this point, output 1406 of the control loop may equal setpoint 1402. That is, the error signal may be zero or within a predefined range, indicating that the deformation sensed by each displacement sensor 518 is approximately the same. This deformation value may be further defined through the control loop to achieve a desired pressure between array of micro devices 1610 and receiving substrate 2101. For example, sufficient pressure may be applied to ensure secure contact while avoiding damage to micro devices from excessive pressure application.

Referring again to FIG. 20, at operation 2020 a voltage is removed from array of electrostatic transfer heads. As shown in FIG. 23, with array of micro devices 1610 placed in contact with receiving substrate 2101, an electrostatic voltage may be removed from electrostatic transfer heads 703. More specifically, operating voltage transmitted from operating voltage supply 1304 to array of electrostatic transfer heads 703 may be discontinued based on control signals from computer system 108. For example, the control signals may be based on a control algorithm instructing that electrostatic transfer heads 703 be deactivated if a predefined deformation is sensed in each displacement sensor 518 simultaneously during a placement operation. As a result, array of micro devices 1610 are released from array of electrostatic transfer heads 703.

Figure 24:
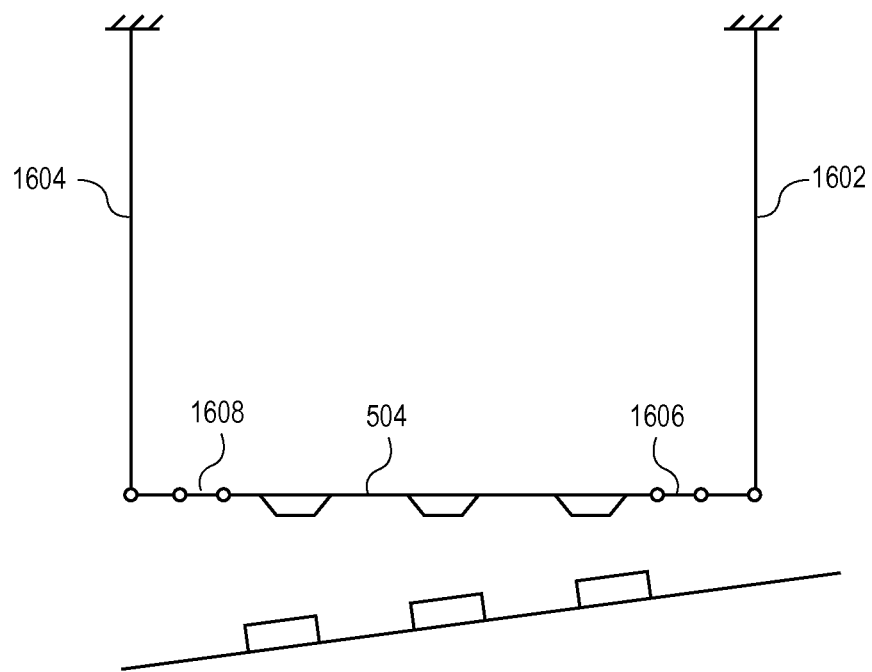
FIG. 24 is a schematic illustration of a mass transfer tool manipulator assembly releasing an array of micro devices onto a receiving substrate in accordance with an embodiment of the invention.

Referring again to FIG. 20, at operation 2025 array of micro devices 1610 may be released onto receiving substrate 2101. Referring to FIG. 24, a schematic illustration of a mass transfer tool manipulator assembly releasing a micro device onto a receiving substrate is shown in accordance with an embodiment of the invention. First schematic actuator 1602 and second schematic actuator 1604 may be controlled by computer system 108 to retract pivot platform 504 from receiving substrate 2101. During retraction, first schematic beam 1606 and second schematic beam 1608 may return toward an undeformed state, as the beams release stored energy and spring back to an initial configuration. Simultaneously, displacement sensors associated with the beams may transmit signals to position sensing module 316 that indicate no deformation of the beams. However, at this stage a control algorithm may instruct that pivot platform 504 be retracted further to clear the pivot platform 504 and to begin another pick up operation. This retraction may be achieved through actuation of actuator assembly 220, or in another embodiment, through actuation of various actuators of mass transfer tool 100. Furthermore, in an embodiment, retraction may be achieved by deactivating actuator assembly 220 and allowing the inherent stiffness of flexible coupling 414 of tip-tilt-z flexure 230 to restore tip-tilt-z flexure 230 to an initial state, which causes retraction of micro pick up array mount 250.

During the placement operation described with respect to FIG. 20, heat may be applied to the array of micro devices 1610. For example, heating element 602 may be resistively heated as described above to transfer heat through micro pick up array mount 250 into the array of electrostatic transfer heads that grip micro devices 1610. Maintaining an elevated temperature of micro pick up array mount 250 in this manner may avoid some problems that arise from temperature variations in an operating environment. Micro devices 1610 may be heated continuously throughout the placement operation. However, more particularly, micro devices 1610 may be heated after deflection of compliant element is sensed and/or after micro devices 1610 are in contact with receiving substrate 2101. In an embodiment, each electrostatic transfer head 703 in the array is heated uniformly, e.g., to a temperature of 50 degrees Celsius, 180 degrees Celsius, 200 degrees Celsius, or even up to 350 degrees Celsius. These temperatures may cause melting or diffusion between micro devices 1610 and receiving substrate 2101 to bond the micro devices to the receiving substrate.

Figure 25:
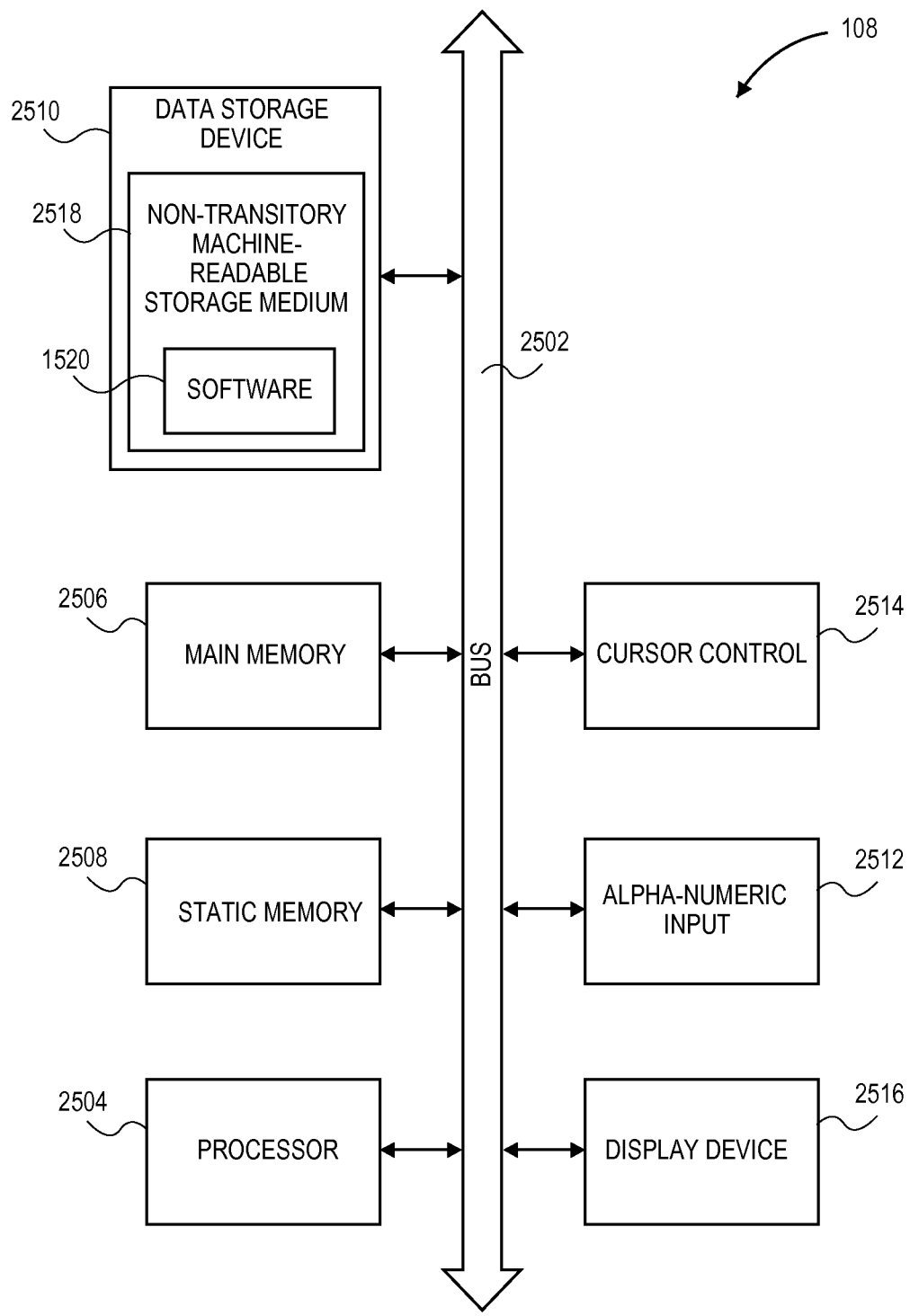
FIG. 25 is a schematic illustration of computer system that may be used in accordance with an embodiment of the invention.

Referring to FIG. 25, a schematic illustration of a computer system that may be used is shown in accordance with an embodiment of the invention. Portions of embodiments of the invention are comprised of or controlled by non-transitory machine-readable and machine-executable instructions which reside, for example, in machine-usable media of a computer system 108. Computer system 108 is exemplary, and embodiments of the invention may operate on or within, or be controlled by a number of different computer systems including general purpose networked computer systems, embedded computer systems, routers, switches, server devices, client devices, various intermediate devices/nodes, stand-alone computer systems, and the like. Furthermore, although some components of a control system, e.g., amplifier 1404 and position sensing module 316, have been broken out for discussion separately above, computer system 108 may integrate those components directly or include additional components that fulfill similar functions.

Computer system 108 of FIG. 25 includes an address/data bus 2502 for communicating information, and a central processor 2504 unit 2504 coupled to bus 2502 for processing information and instructions. Computer system 108 also includes data storage features such as a computer usable volatile memory 2506, e.g. random access memory (RAM), coupled to bus 2502 for storing information and instructions for central processor 2504 unit, computer usable non-volatile memory 2508, e.g. read only memory (ROM), coupled to bus 2502 for storing static information and instructions for the central processor 2504 unit, and a data storage device 2510 (e.g., a magnetic or optical disk and disk drive) coupled to bus 2502 for storing information and instructions. Computer system 108 of the present embodiment also includes an optional alphanumeric input device 2512 including alphanumeric and function keys coupled to bus 2502 for communicating information and command selections to central processor 2504 unit. Computer system 108 also optionally includes an optional cursor control device 2514 coupled to bus 2502 for communicating user input information and command selections to central processor 2504 unit. Computer system 108 of the present embodiment also includes an optional display device 2516 coupled to bus 2502 for displaying information.

The data storage device 2510 may include a non-transitory machine-readable storage medium 2518 on which is stored one or more sets of instructions (e.g. software 2520) embodying any one or more of the methodologies or operations described herein. Software 2520 may also reside, completely or at least partially, within the volatile memory 2506, non-volatile memory 2508, and/or within processor 2504 during execution thereof by the computer system 108, the volatile memory 2506, non-volatile memory 2508, and processor 2504 also constituting non-transitory machine-readable storage media.

As used above, "coupling", "fastening", "joining", "retaining", etc., of one component against or with another may be accomplished using various well-known methods, such as bolting, pinning, clamping, thermal or adhesive bonding, etc. The use of such terms is not intended to be limiting, and indeed, it is contemplated that such methods may be interchangeable in alternative embodiments within the scope of the invention.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A micro pick up array mount comprising:
   a pivot platform;
   a base laterally around the pivot platform;
   a compliant element between the pivot platform and the base, wherein the compliant element is coupled with the pivot platform at an inner pivot and coupled with the base at an outer pivot;
   a strain gauge integrated along a length of the compliant element; and
   a reference strain gauge integrated along the length of the compliant element.

2. The micro pick up array mount of claim 1, further comprising:
   a second compliant element coupled with the base at a second outer pivot and coupled with the pivot platform at a second inner pivot; and a second strain gauge integrated along a respective length of the second compliant element.

3. The micro pick up array mount of claim 1, wherein the compliant element is coupled with the pivot platform at a second inner pivot and coupled with the base at a second outer pivot.

4. The micro pick up array mount of claim 3, wherein the inner pivot is across the pivot platform from the second inner pivot, and wherein the outer pivot is across the pivot platform from the second outer pivot.

5. The micro pick up array mount of claim 1, wherein the compliant element comprises a beam, and wherein the strain gauge is integrated with the beam in a strain region near the inner pivot or the outer pivot.

6. The micro pick up array mount of claim 5, wherein the strain gauge is bonded to the strain region.

7. The micro pick up array mount of claim 5, wherein the strain gauge is deposited on the strain region.

8. The micro pick up array mount of claim 5, wherein the strain region is doped to form the strain gauge.

9. The micro pick up array mount of claim 5, wherein the reference strain gauge is adjacent to the strain gauge on the beam, and wherein the strain gauge and the reference strain gauge provide adjacent legs in a half Wheatstone bridge.

10. The micro pick up array mount of claim 1 further comprising a temperature sensor on the pivot platform.

11. The micro pick up array mount of claim 1 further comprising a heating contact on the base in electrical connection with a heating element over the pivot platform.

12. The micro pick up array mount of claim 11, wherein the heating element comprises a resistance alloy.

13. The micro pick up array mount of claim 11, wherein the heating element comprises a surface-mount technology resistor.

14. The micro pick up array mount of claim 1 further comprising a strain gauge contact on the base in electrical connection with the strain gauge.

15. The micro pick up array mount of claim 1 further comprising a base operating voltage contact on the base in electrical connection with a pivot platform operating voltage contact on the pivot platform.

16. The micro pick up array mount of claim 1 further comprising a base clamp contact on the base in electrical connection with a clamp electrode at a bonding site on the pivot platform.

17. The micro pick up array mount of claim 1 further comprising a bonding site on the pivot platform, wherein the bonding site comprises a metal selected from the group consisting of: gold, copper, and aluminum.

* * * * *